(12) United States Patent
Monfort

(10) Patent No.: US 12,194,884 B2
(45) Date of Patent: Jan. 14, 2025

(54) BATTERY MANAGEMENT SYSTEM

(71) Applicant: Monfort Technology, LLC, Fairfax, VA (US)

(72) Inventor: Edward Riggs Monfort, Pinellas Park, FL (US)

(73) Assignee: Monfort Technology, LLC, Fairfax, VA (US)

( * ) Notice: Subject to any disclaimer, the term of this patent is extended or adjusted under 35 U.S.C. 154(b) by 85 days.

(21) Appl. No.: 17/912,353

(22) PCT Filed: Mar. 19, 2021

(86) PCT No.: PCT/US2021/023297
§ 371 (c)(1),
(2) Date: Sep. 16, 2022

(87) PCT Pub. No.: WO2021/188987
PCT Pub. Date: Sep. 23, 2021

(65) Prior Publication Data
US 2023/0139353 A1 May 4, 2023

Related U.S. Application Data

(60) Provisional application No. 62/991,965, filed on Mar. 19, 2020, provisional application No. 62/991,982, filed on Mar. 19, 2020.

(51) Int. Cl.
*B60L 58/22* (2019.01)
*B60L 58/12* (2019.01)
(Continued)

(52) U.S. Cl.
CPC .............. *B60L 58/22* (2019.02); *B60L 58/12* (2019.02); *B60L 58/16* (2019.02); *B60L 58/24* (2019.02);
(Continued)

(58) Field of Classification Search
CPC ....... B60L 58/22; B60L 58/24; G01R 31/396; H02J 7/00032; H01M 10/425; H01M 2010/4271; H02M 2220/20
See application file for complete search history.

(56) References Cited

U.S. PATENT DOCUMENTS 5,619,417 A 4/1997 Kendall
5,703,464 A 12/1997 Karunasiri et al.
(Continued)

FOREIGN PATENT DOCUMENTS

CN 101417637 B 9/2015
CN 104880605 B 5/2018
(Continued)

OTHER PUBLICATIONS

International Search Report and Written Opinion mailed Aug. 11, 2021, in counterpart PCT Application No. PCT/US2021/023297, 12 pages.
(Continued)

*Primary Examiner* — Jared Fureman
*Assistant Examiner* — Duc M Pham
(74) *Attorney, Agent, or Firm* — Finnegan, Henderson, Farabow, Garrett & Dunner, L.L.P

(57) ABSTRACT

A battery management system includes a plurality of batteries each comprising a positive terminal and a negative terminal, wherein the positive or negative terminal of each of the plurality of batteries is coupled to the positive or negative terminal of another one of the plurality of batteries; a monitoring board connected to the positive terminal and the negative terminal of at least one of the plurality of batteries; and a controller connected to the monitoring board through the positive terminals and the negative terminals of the plurality of batteries, wherein the monitoring board is configured to monitor a status of the at least one battery and
(Continued)

transmit one or more battery parameters of the at least one battery to the controller, and wherein the controller is configured to adjust performance of the plurality of batteries based on the one or more battery parameters.

20 Claims, 23 Drawing Sheets

(51) Int. Cl.
| | |
|---|---|
| B60L 58/16 | (2019.01) |
| B60L 58/24 | (2019.01) |
| G01R 31/382 | (2019.01) |
| G01R 31/396 | (2019.01) |
| H01M 10/42 | (2006.01) |
| H02J 7/00 | (2006.01) |

(52) U.S. Cl.
CPC ......... *G01R 31/382* (2019.01); *G01R 31/396* (2019.01); *H01M 10/425* (2013.01); *H02J 7/00032* (2020.01); *H02J 7/0047* (2013.01); *H01M 2010/4271* (2013.01); *H01M 2010/4278* (2013.01); *H01M 2220/20* (2013.01)

(56) References Cited

U.S. PATENT DOCUMENTS

| | | |
|---|---|---|
| 8,390,245 B2 | 3/2013 | Niwa et al. |
| 8,531,159 B2 | 9/2013 | Tominaga |
| 8,536,826 B2 | 9/2013 | Matsuoka et al. |
| 2010/0007308 A1* | 1/2010 | Lee ........................ H02J 7/0018 320/138 |
| 2011/0127830 A1* | 6/2011 | Harding ................ B60R 16/033 307/10.7 |
| 2013/0029595 A1 | 1/2013 | Widmer et al. |
| 2013/0078485 A1* | 3/2013 | Muis ..................... H01M 10/48 429/7 |
| 2013/0175976 A1 | 7/2013 | Rana |
| 2015/0072180 A1* | 3/2015 | Willemin .......... H01M 10/4257 429/7 |
| 2015/0340888 A1 | 11/2015 | Hofer |
| 2018/0053965 A1* | 2/2018 | Marcicki ............. H01M 10/482 |
| 2019/0051947 A1* | 2/2019 | Scheucher ............ B60L 53/302 |
| 2020/0152949 A1* | 5/2020 | Rodenburg ......... H01M 10/482 |

FOREIGN PATENT DOCUMENTS

| | | |
|---|---|---|
| KR | 10-2012-0133620 A | 12/2012 |
| KR | 10-2014-0020659 A | 2/2014 |

OTHER PUBLICATIONS

Extended European Search Report for European Application No. EP21770623 dated May 23, 2024, 15 pages.
Zhang Ruoqi et al: "A Novel Battery Management System Architecture Based on an Isolated Power/Data Multiplexing Transmission Bus", IEEE Transactions on Industrial Electronics, vol. 66, No. 8, Aug. 1, 2019, pp. 5979-5991.
Wenger M M et al: "A robust contactless capacitive communication link for high power battery systems", 2014 IEEE 23rd International Symposium on Industrial Electronics (ISIE), IEEE, Jun. 1, 2014, pp. 1766-1772.

* cited by examiner

BATTERY MANAGEMENT SYSTEM

RELATED APPLICATIONS

[1] This application is a national stage application under 35 U.S.C. § 371 of international application number PCT/US2021/023297, filed Mar. 19, 2021, which designated the United States; and claims priority under 35 U.S.C. § 119 to U.S. Provisional Patent Application Nos. 62/991,965, filed on Mar. 19, 2020 and 62/991,982, filed on Mar. 19, 2020, both of which are incorporated herein by reference in their entireties.

TECHNICAL FIELD

The present disclosure relates to a novel battery management system and more particularly pertains to a battery management system that monitors individual battery cells.

BACKGROUND

The use of battery management systems of various designs and configurations is known in the industry and is widely adapted. One such use is in electric vehicles, where an array of multiple battery cells are wired together to power a main electrical motor. Conventional battery management systems used to monitor this array of battery cells are known to consist basically of familiar, expected, and obvious structural configurations, notwithstanding various design problems that each conventional system purports to solve.

While these systems may fulfill their respective, particular objectives and requirements, they fail to address one shortcoming—the need for hundreds of wires connected across the array. The wires typically include (1) two wires between a battery management controller and each battery cell in the array and (2) two wires for each thermocouple placed at various positions in the array. With a typical electric vehicle utilizing anywhere from 50 to 100 battery cells, one battery management system may include at least 100 wires, not including the two wires for every thermocouple and other wires necessary for peripheral functionalities. The large number of wires presents numerous engineering challenges. For example, the wires take up valuable physical space, each connection point is a potential point of failure, physically connecting each wire to the battery cells requires too much time, etc. Such challenges also limit the number of battery cells that can be installed in a vehicle, which is a roadblock to increasing power and/or range of electric vehicles.

One conventional solution involves grouping battery cells into modules or packs. For example, an array of 100 battery cells can be divided into 10 modules, each containing 10 battery cells. The modules can also be divided into 2 battery packs, each containing 5 modules. This grouping of battery cells reduces the number of wires by reducing the number of discrete units that must be connected to the battery management controller, but at the cost of decreased monitoring capabilities. As a result, it is not possible to monitor individual battery cell health. Instead, the battery management controller is only able to identify a particular module or a battery pack in the event of a failure and cannot determine which particular battery cell is causing the failure. As a result, one malfunctioning battery cell within a particular module or a battery pack may require a replacement of the entire module or battery pack, which is both wasteful and costly for the end user.

Furthermore, the wires and their arrangements in conventional battery management systems are specific to each array of battery cells. Engineers must design a new wiring arrangement each time they want to design a new array employing a different number of battery cells.

SUMMARY

One aspect of the present disclosure is directed to a battery management system. The battery management system comprises a plurality of batteries each comprising a positive terminal and a negative terminal, wherein the positive or negative terminal of each of the plurality of batteries is coupled to the positive or negative terminal of another one of the plurality of batteries; a monitoring board connected to the positive terminal and the negative terminal of at least one of the plurality of batteries; and a controller connected to the monitoring board through the positive terminals and the negative terminals of the plurality of batteries, wherein the monitoring board is configured to monitor a status of the at least one battery and transmit one or more battery parameters of the at least one battery to the controller, and wherein the controller is receive the transmitted battery parameters, the controller further configured to configured to adjust performance of the plurality of batteries based on the one or more battery parameters.

Another aspect of the present disclosure is directed to a battery management method. The method comprises: receiving a modulated data signal offset by a DC voltage; removing the DC voltage to extract the modulated data signal; conditioning the modulated data signal to remove noise; demodulating the modulated data signal to extract a bitstream containing a data packet; decoding the data packet to parse a message regarding one or more parameters of a battery; and outputting the one or more parameters of the battery.

Yet another aspect of the present disclosure is directed to a battery management method. The method comprises: generating a message regarding one or more parameters of a battery; encoding the message into a data packet for serial communication; converting the data packet into a bitstream; modulating the bitstream to generate a modulated data signal; conditioning the modulated data signal to remove distortion; and injecting the modulated data signal onto a DC voltage line, wherein the DC voltage line is coupled to power an electrical motor.

Other systems, methods, and computer-readable media are also discussed herein.

DETAILED DESCRIPTION

Figure 1:
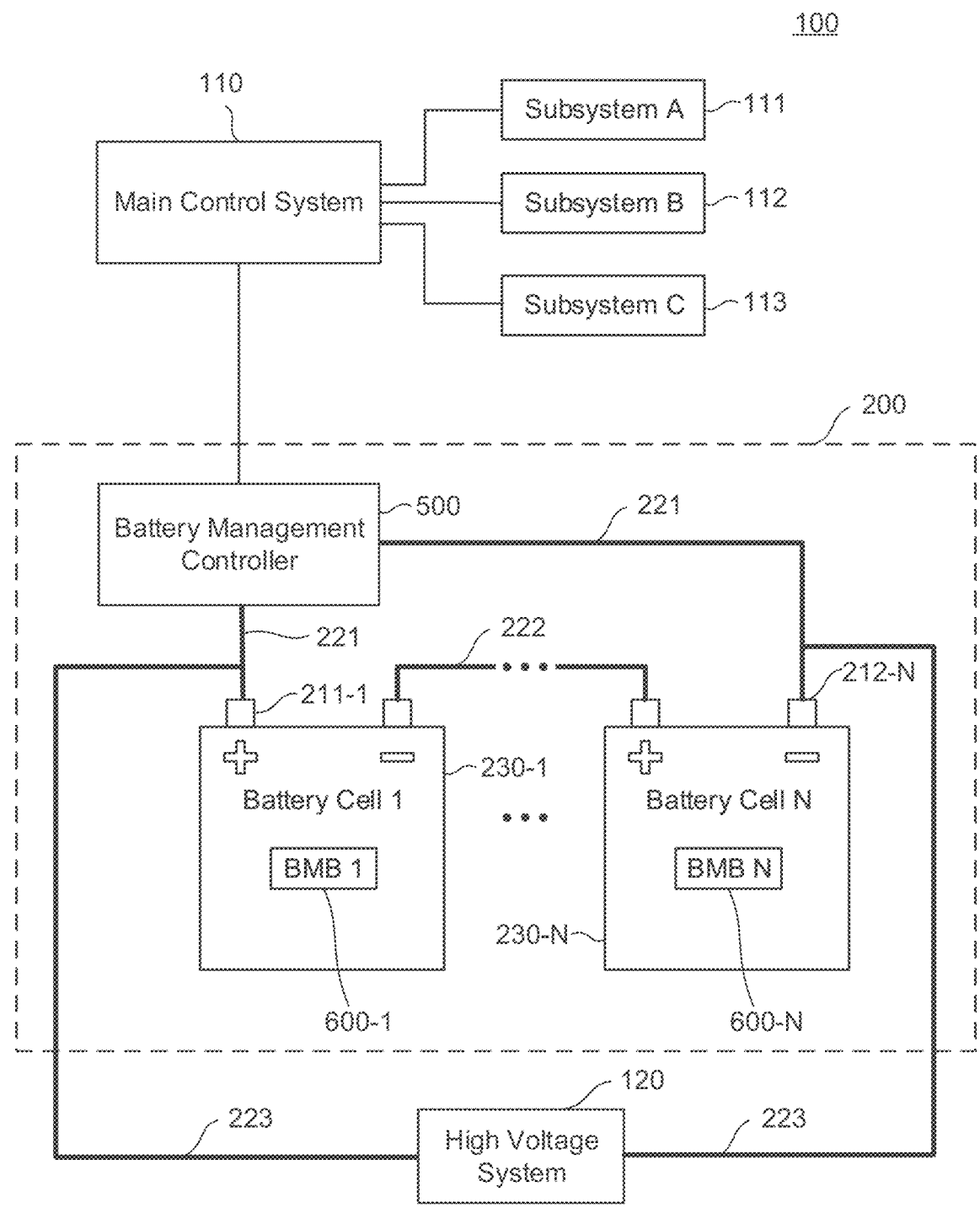
FIG. 1 is a schematic diagram illustrating an exemplary embodiment of a system utilizing a battery management system, consistent with disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components and steps illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope of the invention is defined by the appended claims.

Embodiments of the present disclosure are directed to a novel battery management system and its application, in which a plurality of battery cells are individually monitored and controlled without a complex web of wires. The battery management system allows each battery cell to communicate with a central controller using the cables that are already placed on the battery cells. Another aspect of the present disclosure is directed to an integrated vehicle power system.

FIG. 1 is a schematic diagram illustrating an exemplary embodiment of an overall system 100 utilizing a battery management system (BMS) 200, consistent with disclosed embodiments. As used herein, overall system 100 may represent a wide range of applications, such as electric vehicles, hybrid vehicles, building power reserve systems, or any other systems that can be powered partially or entirely by one or more batteries. Other applications are also within the scope of disclosed embodiments, in which different types of battery cells (e.g., lithium-ion batteries, NiMH batteries, NiCd batteries, or the like) and other types of individually packaged power sources, such as fuel cells, are used.

Overall system 100 includes a main control system 110, a number of subsystems (e.g., subsystems A-C 111-113), and BMS 200. In some embodiments, BMS 200 may be one of the subsystems coupled with main control system 110 and other subsystems to operate overall system 100. As used here, references to subsystems A-C 111-113 are intended to cover any number of systems, subsystems, modules, and devices in communication with main control system 110.

In an embodiment in which overall system 100 corresponds to an electric vehicle, main control system 110 may correspond to an electronic control unit (ECU) for controlling various electronic systems of the vehicle, such as transmission, cruise control, steering, audio systems, charging, and/or other functionalities in the vehicle controlled by electronic components. Alternatively, main control system 110 may correspond to a vehicle control unit (VCU) for controlling torque coordination, operation and gearshift strategies, high-voltage and low-voltage coordination, charging control, on board diagnosis, thermal management, and/or other functionalities associated with powertrains. Each of the functionalities enumerated above may be implemented by subsystems (e.g., subsystems A-C 111-113).

In some embodiments, each of main control system 110, subsystems A-C 111-113, and BMS 200 may comprise a processor (not shown), a memory (not shown), input/output (I/O) ports (not shown), and other electrical components suitable for their intended purposes.

The processor may include one or more dedicated processing units, application-specific integrated circuits (ASICs), field-programmable gate arrays (FPGAs), or various other types of processors or processing units. The processor may be configured to perform computations on signals processed via the I/O ports. The processor may be further configured to control other connected systems and subsystems by transmitting messages via the I/O ports.

The memory may be any type of computer-readable storage medium including volatile or non-volatile memory devices, or a combination thereof. The memory may store computer-readable program instructions, mathematical models, and/or algorithms that are used in signal processing. The memory may further store computer-readable program instructions for execution by the processor to perform its intended purposes.

The I/O ports may include various ports, interfaces, antennae suitable for interfacing with another system, subsystem, sensor, module, or device. One type of I/O port may include an array of individual ports on a circuit board configured to transmit and receive digital data communication or analog signals. Another type of I/O port may include ports that are connected to sensors such as a temperature sensor, touch sensor, humidity sensor, or the like for acquiring a measurement of surrounding environment. Yet another type of I/O port may include ports connected to output devices and input devices. The output devices may be used to report a result of the processor's activities to a user or another device. The output devices may include a user interface including a display or an auditory device such as a speaker. The display may be configured to display a result of the processor's activities, a status of various systems, subsystems, modules, and/or sensors, data stored at the memory, etc. The display may include, but is not limited to, cathode ray tube (CRT), liquid crystal display (LCD), light-emitting diode (LED), gas plasma, a touch screen, or other image projection devices for displaying information to a user. Additionally or alternatively, the display may include one or more LEDs that turn on or off or change color to represent different states. The input devices may be any type of computer hardware equipment used to receive data and control signals from a user. The input devices may include, but are not limited to, a keyboard, a mouse, a scanner, a digital camera, a joystick, a trackball, cursor direction keys, a touchscreen monitor, audio/video commanders, a switch, a button, graphical user interface (GUI) elements displayed on a display, etc. The I/O ports may further include a machine interface, such as an electrical bus connection or a wireless communications link configured to transfer data between two computer-implemented systems.

BMS 200, in some embodiments, includes a battery management controller (BMC) 500 and an array of battery cells 230-1 to 230-N producing high voltage (HV) direct current (DC) voltage. Each battery cell may have a battery management board (BMB) 600 installed thereon. The array of battery cells 230-1 to 230-N is referred to herein collectively as battery cells 230 or individually as battery cell 230. BMC 500 and battery cells 230 are connected by HV data cables 221, HV bus bars 222, and HV power cables 223.

BMC 500 is configured to monitor and control battery cells 230 via HV data cables 221 and HV bus bars 222, without the need for any other wires connecting BMC 500 directly to each battery cell 230 (or BMB 600 described below). HV bus bars 222 refer to the electrical connectors coupling positive and negative terminals of battery cells 230 except for one positive terminal (i.e., a most positive terminal 211-1) and one negative terminal (i.e., a most negative terminal 212-N) at each end of the array of battery cells 230. Therefore, BMS 200 of the present disclosure adds only two cables (i.e., HV data cables 221) to an array of battery cells 230, while still allowing each battery cell 230 to be monitored. In some embodiments, BMC 500 may also be configured to analyze, process, and relay information on battery cells 230 to main control system 110 and subsystems A-C 111-113.

Because of this ability to communicate with individual BMB 600 in each battery cell 230 using just two cables (i.e., HV data cables 221), BMS 200 is able to interface with hundreds (e.g., up to 1024) or even thousands (e.g., up to 4096) of battery cells 230 without additional cables. An engineer would be able to interface BMC 500 to a different number of battery cells 230 just by adding or removing a desired number of battery cells 230 and connecting their positive and negative terminals with additional HV bus bars 222. All other aspects of BMS 200 (e.g., communication protocol, HV data cables 221, HV power cables 223) can remain the same without affecting their functionality. Interfacing with even more battery cells 230 is also possible by changing communication protocol in software, which is also within the scope of the present disclosure.

For purposes of description, battery cells 230 includes N number of battery cells 230, that number being scalable up or down based on user need without adding to the electrical complexity of BMS 200. Battery cells 230 may be connected in series, in parallel, or in any configuration that can provide desired levels of voltage and current, as will be described below with respect to FIGS. 3A-3C. In some embodiments, each battery cell 230 is capable of providing 1.8V to 5.0V DC, which may combine to provide HV DC voltage on the order of a few hundred volts (e.g., 350V or 480V) or even above 1000V (e.g., 1500V). This HV DC voltage is present on the electrical connections coupled to battery cells 230 (I.e., HV data cables 221, HV bus bars 222, and HV power cables 223). The cables carrying this HV DC voltage are denoted in FIGS. 1, 2A-2C, and 7 as bolded lines. Other voltages for individual battery cell 230 (i.e., lower than 1.8V or higher than 5.0V can also be utilized and are within the scope of disclosed embodiments. Other levels of HV DC voltage are also within the scope of disclosed embodiments, where different number of battery cells 230 may be coupled to output any desired HV DC voltage.

As seen in FIGS. 1, 2A-2C, and 7, the HV DC voltage is confined to select components of overall system 100. These include BMC 500, battery cells 230, and a HV system 120, such as an electric motor or any other system that is powered by battery cells 230. While there may be other systems, subsystems, and devices not shown in FIG. 1, not all components of overall system 100 are coupled to receive the HV DC voltage. Instead, the other components of overall system 100 may be powered by a lower voltage power source such as a 12V lead-acid battery found in conventional vehicles. Other lower voltage power sources of any voltage are also within the scope of disclosed embodiments.

Further, the components powered by the lower voltage power sources may be shielded from the HV DC voltage with isolating circuits. This is because powering every component using the HV DC voltage may be costly and dangerous. A short circuit in a device connected to receive or carry the HV DC voltage, for example, may cause irreparable damage to the connected device or to the user. As a further protection, all circuits of BMS 200 may be protected from incorrectly connected power sources, such that the circuit will not be damaged even when a power source is connected in with reverse polarity (e.g., a positive cable connected to a negative terminal).

Each battery cell (e.g., 230-1) comprises a BMB (e.g., BMB 600-1), collectively BMBs 600, configured to monitor the status of a single battery cell (e.g., battery cell 230-1) to which it is coupled. While one BMB 600 is preferably coupled to each battery cell 230 in a one-to-one correspondence, other ratios of BMBs 600 to battery cells 230 are also within the scope of disclosed embodiments. As with BMC 500, each BMB 600 may be configured to communicate with BMC 500 via HV data cables 221 and HV bus bars 222, without the need for any other cables connecting BMB 600 directly to BMC 500 or to any other BMB 600.

In addition, while it may be possible to eliminate excessive wires by configuring each component of the battery management system (e.g., BMC 500 and BMBs 600) to communicate wirelessly using radiofrequency (RF) or Bluetooth signals, such wireless communication may cause problems. For example, the wireless signals can interfere with each other and with other wireless signals such as cellular, radio, and WIFI signals.

HV data cables 221, HV bus bars 222, and HV power cables 223 carry the HV DC voltage and are illustrated as such with thick lines. These HV connections are coupled to positive terminals 211 (i.e., cathodes) and negative terminals 212 (i.e., anodes) of battery cells 230. Specifically, HV data cables 221 connect BMC 500 to most positive terminal 211-1 and most negative terminal 212-N of battery cells 230. HV bus bars 222 connect positive terminals and negative terminals of battery cells 230 in sequence based on different configurations described below with respect to FIG. 3A-3C. HV power cables 223 also connect HV system 120 to most positive terminal 211-1 and most negative terminal 212-N of battery cells 230.

Because each set of cables—HV data cables 221, HV bus bars 222, and HV power cables 223—are essentially three parallel sets of cables coupling most positive terminal 211-1 and most negative terminal 212-N of battery cells 230, these three types of cables carry the same voltage at any given moment in time. Nonetheless, BMC 500, BMBs 600, and HV system 120 are configured to extract data signals traveling in the cables without interference, as will be described below.

Figure 2:
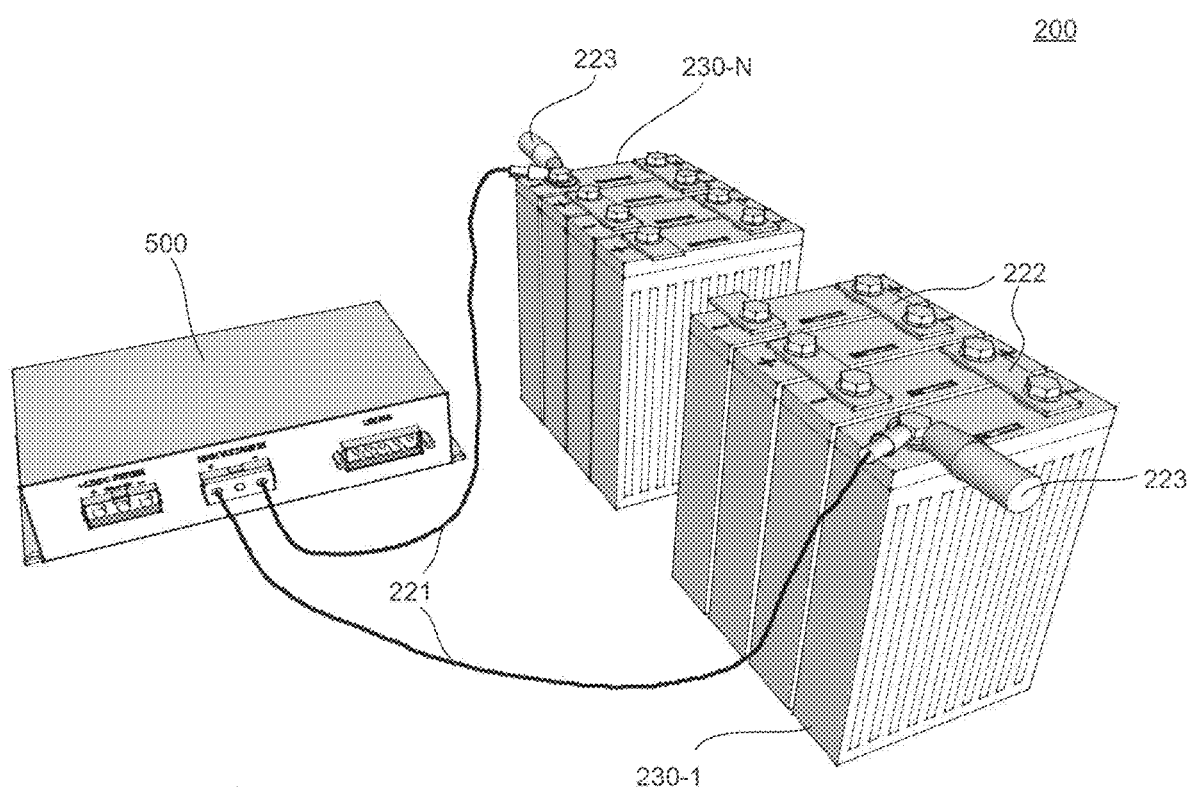
FIG. 2 is a perspective view of an exemplary battery management system, consistent with disclosed embodiments.

FIG. 2 is a perspective view of BMS 200, consistent with disclosed embodiments. As described above, BMS 200 comprises BMC 500, battery cells 230-1 to 230-N, HV data cables 221, HV bus bars 222, and HV power cables 223. As also described above and illustrated in FIG. 2, HV data cables 221, HV bus bars 222, and HV power cables 223 are the only electrical connections necessary to achieve the functions of BMS 200 described herein.

Figure 3A:
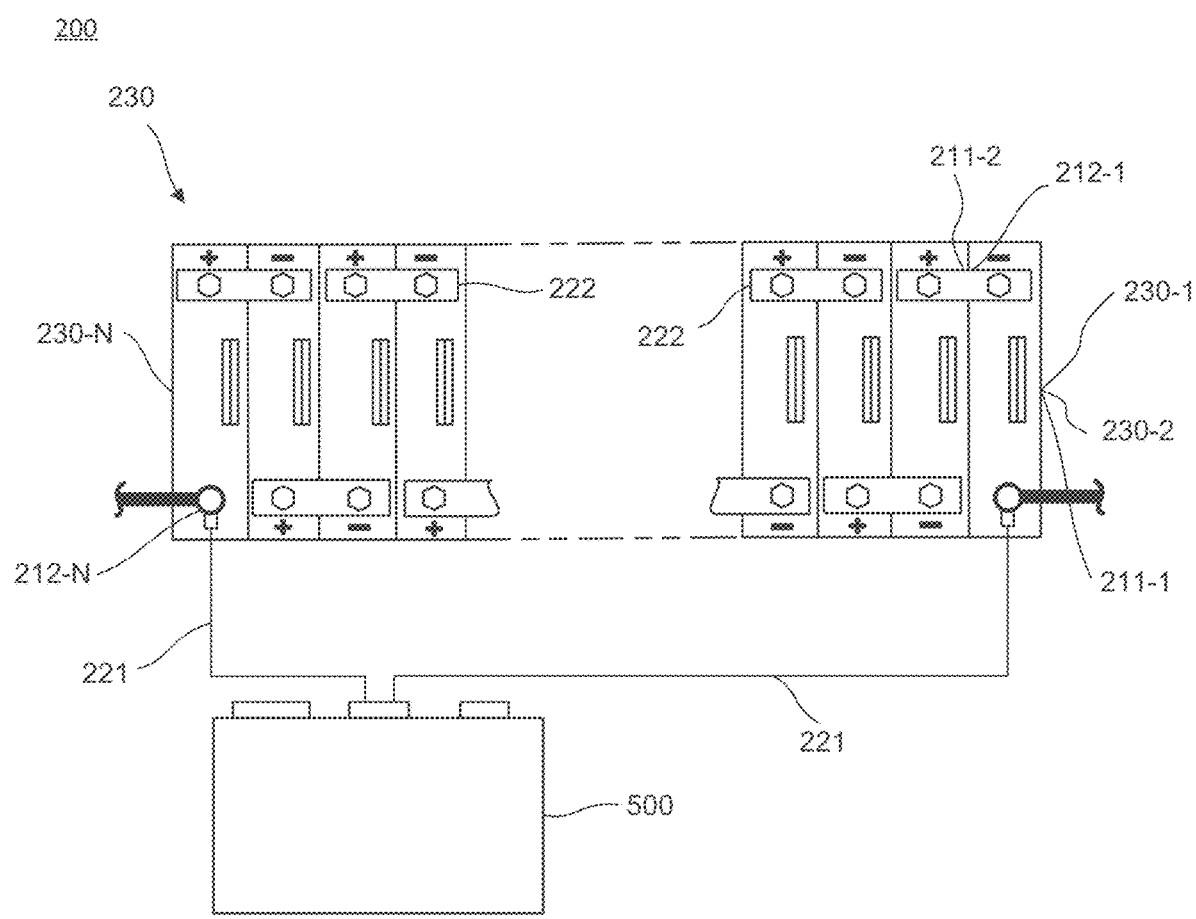
FIG. 3A is a top-down view of an exemplary battery management system having battery cells connected in series, consistent with disclosed embodiments.

FIG. 3A is a top-down view of BMS 200 having battery cells 230 connected in series, consistent with disclosed embodiments. BMC 500 is shown with HV data cables 221 connected to most positive terminal 211-1 and most negative terminal 212-N of battery cells 230. Individual HV bus bars 222 are also shown connecting each adjacent pair of positive terminal (e.g., positive terminal 211-2 of battery cell 230-2) and negative terminal (e.g., negative terminal 212-1 of battery cell 230-1). In this way, BMC 500, and positive terminals 211 and negative terminals 212 of battery cells arranged in series, form a closed loop connected by HV data cables 221 and HV bus bars 222.

Figure 3B:
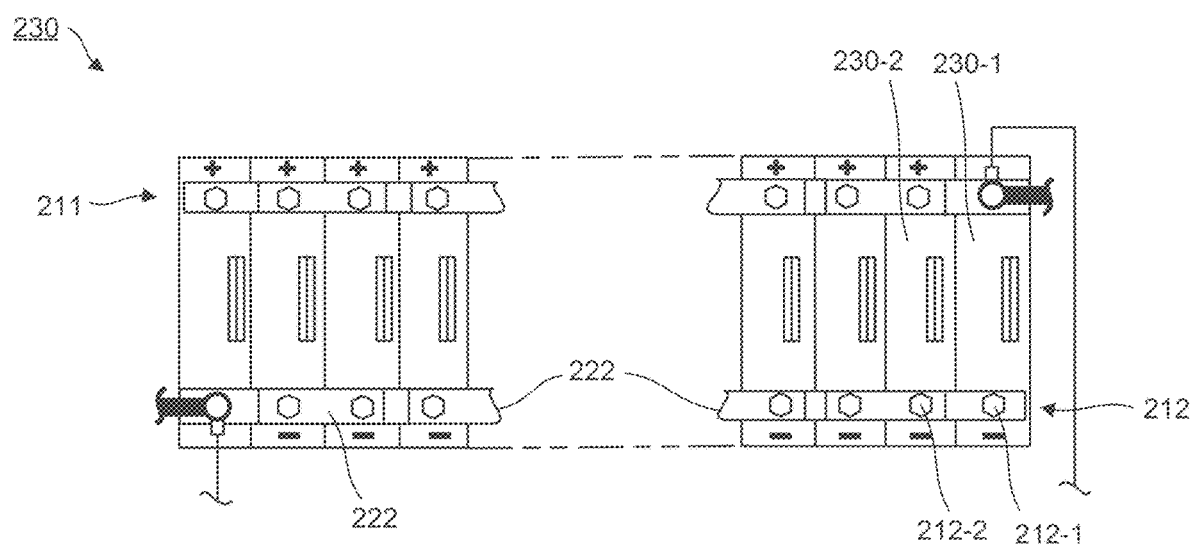
FIG. 3B is a top-down view of another exemplary array of battery cells connected in parallel, consistent with disclosed embodiments.

FIG. 3B is a top-down view of another exemplary array of battery cells 230 connected in parallel, consistent with disclosed embodiments. The illustrated components are similar to those of FIG. 3A except for the arrangement of positive terminals 211 and negative terminals 212 of battery cell 230 as well as HV bus bars 222 connected between adjacent terminals of the same polarity (e.g., negative terminal 212-1 and negative terminal 212-2). Battery cells 230-1, 230-2, etc. of FIG. 3A are arranged so that positive terminals and negative terminals alternate ( . . . +, −, +, − . . . ), whereas battery cells 230-1, 230-2, etc. of FIG. 3B are arranged so that positive terminals 211 are arranged adjacent to each other on one side of the battery cell array and negative terminals 212 are arranged adjacent to each other on the other side of the battery cell array.

Figure 3C:
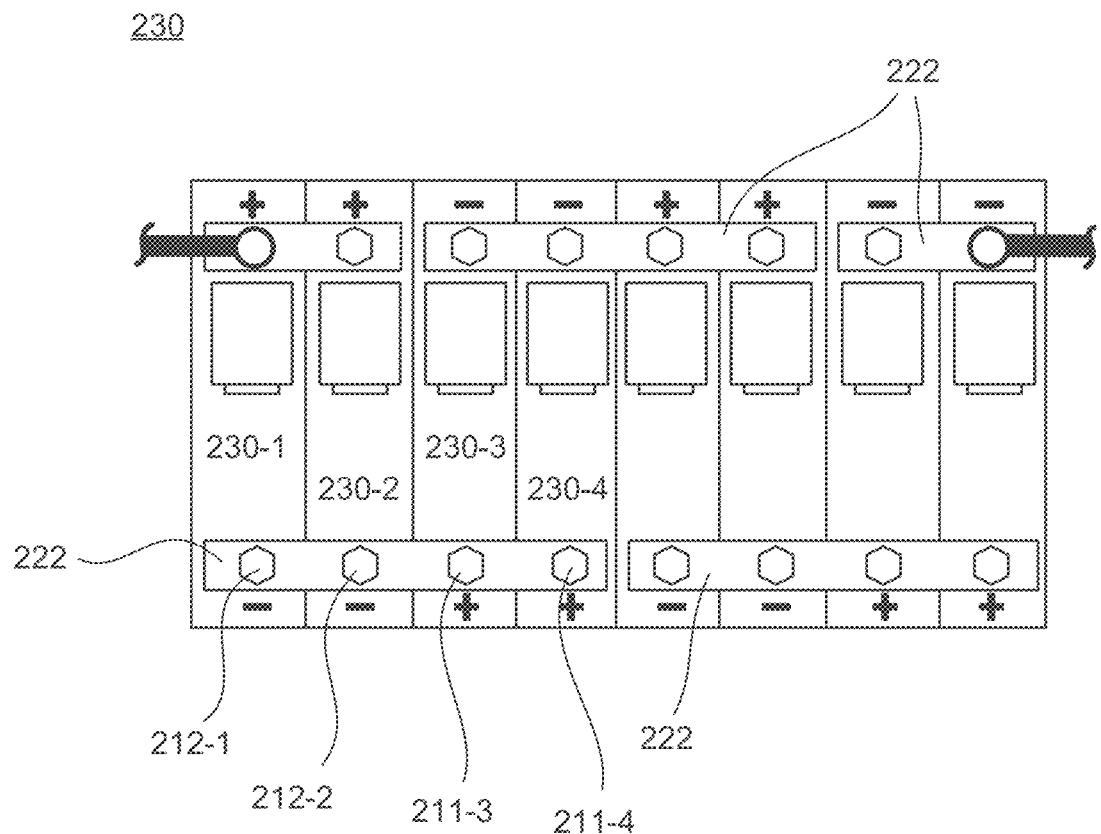
FIG. 3C is a top-down view of another exemplary array of battery cells connected in series and in parallel, consistent with disclosed embodiments.

FIG. 3C is a top-down view of another exemplary array of battery cells 230 connected in series and in parallel, consistent with disclosed embodiments. Similar to FIGS. 3A and 3B except for the arrangement of the terminals and how HV bus bars 222 are connected, FIG. 3C shows HV bus bars 222 connecting same polarity terminals of battery cells 230 connected in parallel (negative terminals 212-1 and 212-2 of battery cells 230-1 and 230-2; and positive terminals 211-3 and 211-4 of battery cells 230-3 and 230-4), and connecting the two sets of terminals (negative terminals 212-1 and 212-2; and positive terminals 211-3 and 211-4) together to connect the two sets of battery cells (battery cells 230-1 and 230-2; and battery cells 230-3 and 230-4) in series. It is noted that such a hybrid arrangement of battery cells 230 cannot be achieved in conventional battery management systems connecting a conventional BMC to individual conventional BMBs directly, since the wires and the signals traveling therein would interfere with each other.

FIGS. 4A-4D are different views of exemplary battery cells 230 of different embodiments for coupling BMB 600 to a battery cell 230, consistent with disclosed embodiments. As described above, one BMB 600 is preferably coupled to each battery cell 230. Even in other embodiments in which one BMB 600 is connected to a group of more than one battery cells 230, the one BMB 600 may be installed on one of the battery cells 230 in a manner similar to that shown in FIGS. 4A-4D.

Figure 4A:
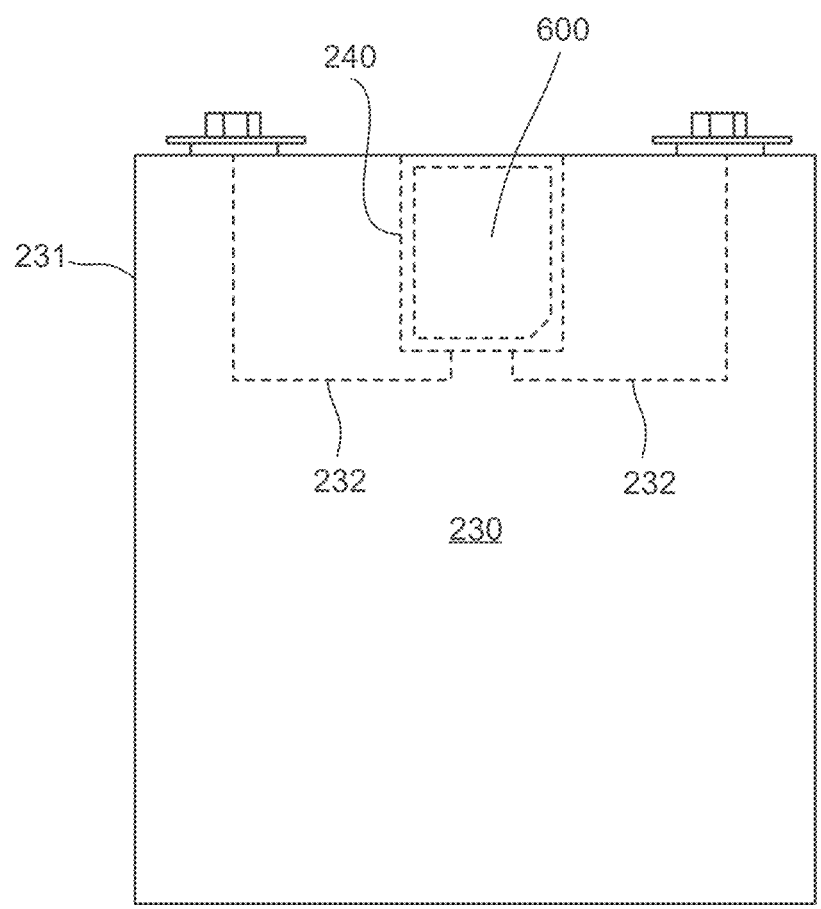
FIG. 4A is a side view of an exemplary battery cell with a slot containing an exemplary battery management board, consistent with disclosed embodiments.

FIG. 4A is a side view of an exemplary battery cell 230 with a slot 240 containing an exemplary BMB 600, consistent with the disclosed embodiments. Here, slot 240 is positioned so that its opening extends into an external enclosure 231 of battery cell 230 and so that slot 240 is connected to the terminals of battery cell 230 internally via connections 232. Using slot 240 to connect BMB 600 to battery cell 230 allows BMB 600 to be removable so that it can be replaced without having to replace the entire battery cell 230. In some embodiments, slot 240 may be positioned on any side of external enclosure 231, such as on top as shown in FIG. 4A, the sides, or the bottom. Furthermore, slot 240 may be accessible from the outside without opening external enclosure 231 in some embodiments, while the opening of slot 240 may be covered by external enclosure 231 in others.

Figure 4B:
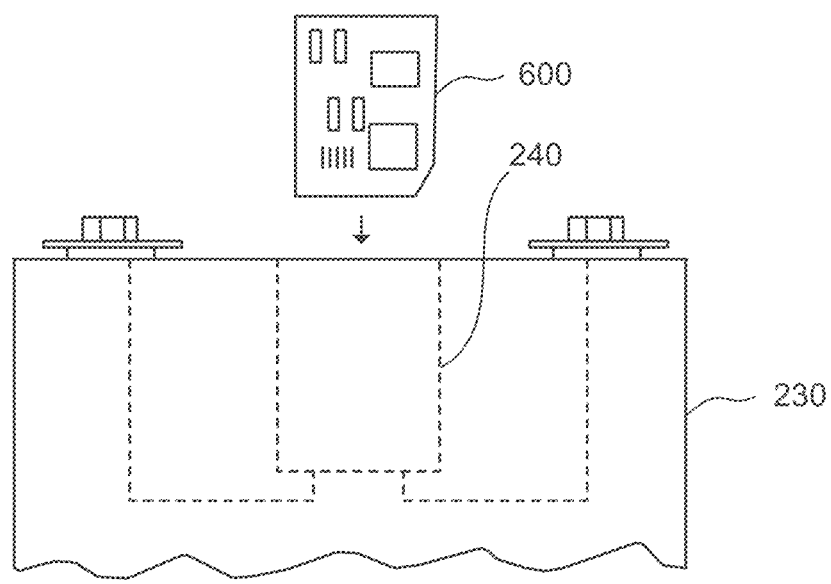
FIG. 4B is a side view of an upper portion of another exemplary battery cell similar to FIG. 4A and another exemplary battery management board located outside of a slot, consistent with disclosed embodiments.

FIG. 4B is a side view of an upper portion of exemplary battery cell 230 of FIG. 4A with BMB 600 positioned outside of slot 240 and intended for insertion into slot 240, consistent with disclosed embodiments.

Figure 4C:
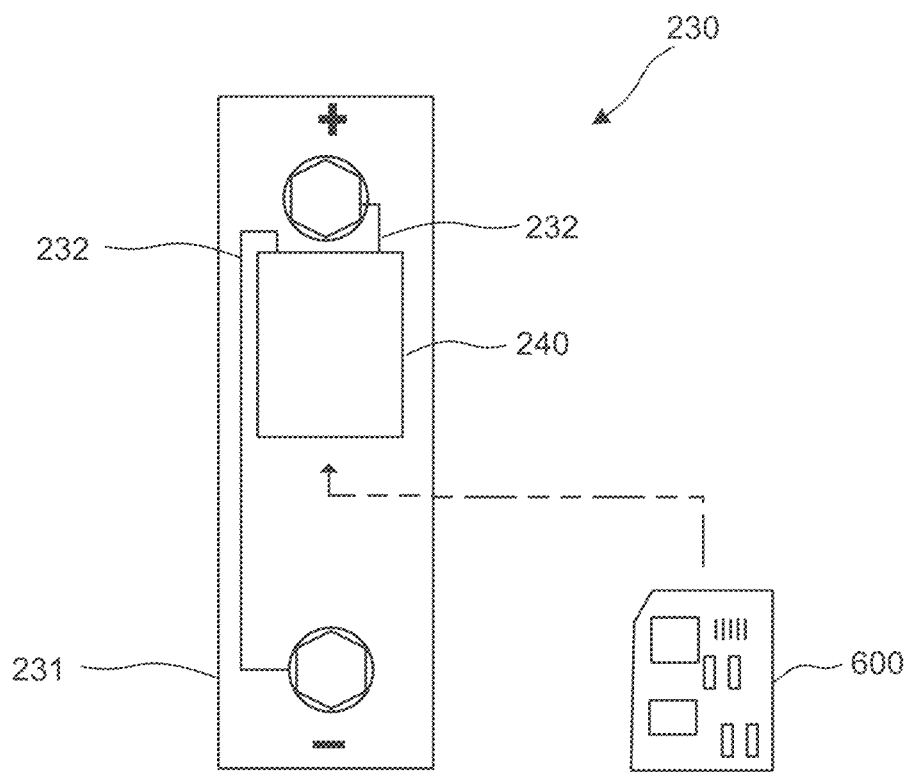
FIG. 4C is a top-down view of another exemplary battery cell with a slot for another exemplary battery management board, consistent with disclosed embodiments.

FIG. 4C is a top-down view of another exemplary battery cell 230 with slot 240 for receiving exemplary BMB 600, consistent with disclosed embodiments. Here, slot 240 is positioned on a top portion of battery cell 230 and connected to the terminals externally via connections 232. Slot 240 may be positioned anywhere on external enclosure 231, such as on top as shown in FIG. 4C, the sides, or the bottom.

Figure 4D:
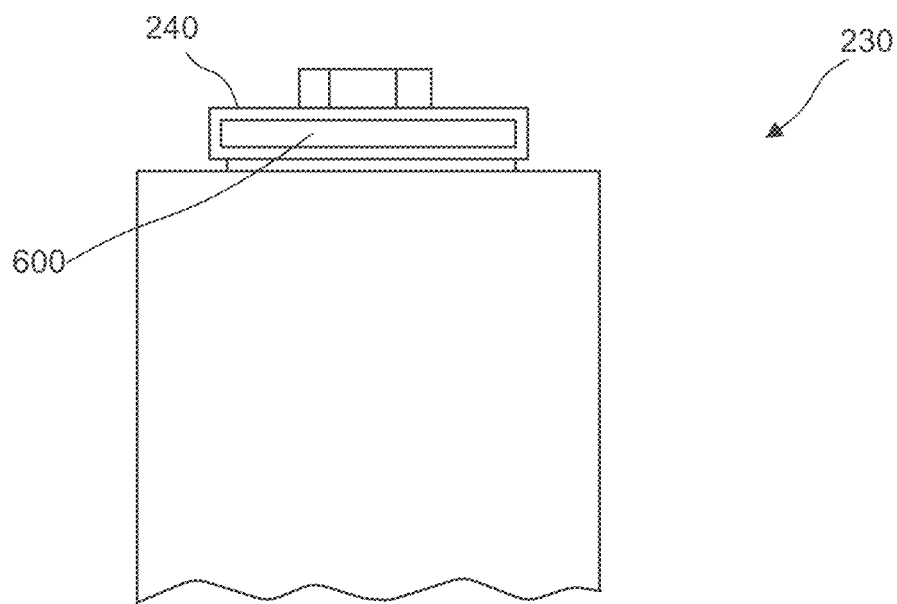
FIG. 4D is a cross-sectional view of an exemplary battery cell similar to FIG. 4C, looking down into the slot, consistent with disclosed embodiments.

FIG. 4D is a cross-sectional view of exemplary battery cell 230 of FIG. 4C, looking down into slot 240, consistent with disclosed embodiments.

The circuit board of BMB 600 is shaped to fit slot 240. The circuit board may also include one or more structural characteristics that allow BMB 600 to be inserted in only one correct orientation. The structural characteristics may include, for example, a notch or a mark at one particular corner, visual indications showing the correct orientation, or other structural characteristics known in the art. In further embodiments, the circuit board of BMB 600 may take the shape of a well-known form factor, such as a Secure Digital (SD) card or a microSD card. This may allow users to easily understand how to insert or replace BMB 600.

Figure 5:
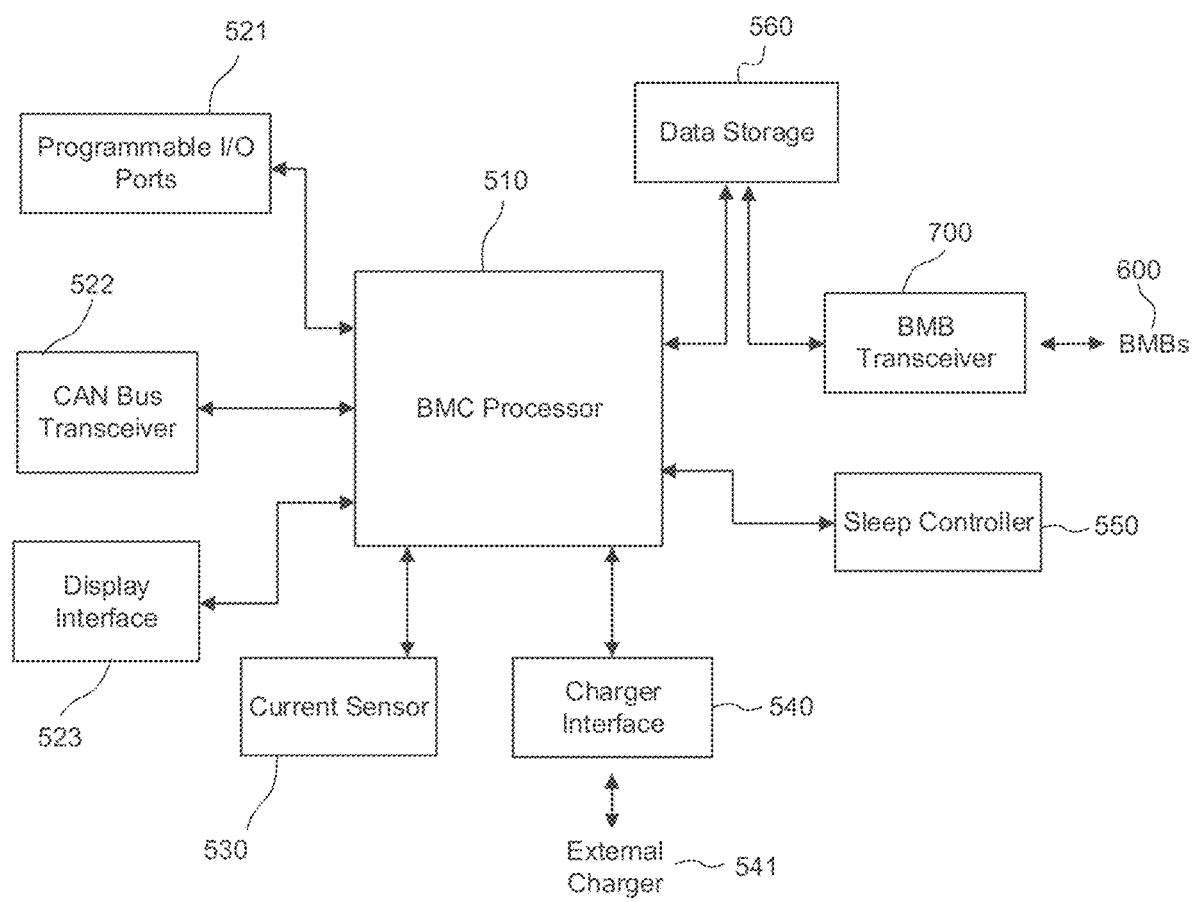
FIG. 5 is a schematic diagram illustrating an exemplary embodiment of a battery management controller, consistent with disclosed embodiments.

FIG. 5 is a schematic diagram illustrating an exemplary embodiment of BMC 500, consistent with disclosed embodiments. BMC 500 may be configured to acquire, manage, and/or monitor information related to the health of battery cells 230. For example, BMC 500 may be configured to keep track of voltage, resistance, current, temperature, discharge and charge limits, charge balancing, and/or other information related to battery cell performance and health.

To this end, BMC 500 may be configured to poll all BMBs 600 periodically and refresh the information of each battery cell 230 based on each poll. In some embodiments, BMC 500 may poll all BMBs 600 in sequence from battery cell 230-1 to battery cell 230-N and continue to cycle through all BMBs 600 over and over. The total time it takes to poll every BMBs 600 and receive responses is based on the particular communication protocol employed by BMS 200. For example, BMS 200 comprising 1024 battery cells 230 (i.e., battery cell 230-1 to battery cell 230-1024) and communicating at 256,000 bits per second may cycle through all BMBs in as little as 4 seconds.

In other embodiments, BMC 500 may be configured to operate in four operating modes—discharge, charge, idle, and sleep. The discharge mode may be considered a default operating mode, where BMC 500 continuously monitors BMBs 600 and HV system 120 is powered by battery cells 230. During charge mode, BMC 500 may actively charge battery cells 230 and continuously poll BMBs 600 to monitor statuses of battery cells 230. Additionally or alternatively, BMC 500 may be configured to poll BMBs 600 at predetermined intervals during discharge mode or charge mode instead of polling them continuously. In some embodiments, BMC 500 may also control charge shunting of BMBs 600 and the output of an external charger 541 for efficient and accurate cell balancing, as will be described below.

During idle mode, BMC 500 may instruct BMS 200 to operate in a low power idle mode, in which battery monitoring remains active but at reduced intervals. For example, BMC 500 may poll BMBs 600 every 1 minute in idle mode, instead of cycling through BMBs 600 continuously. In some embodiments, BMC 500 may further be programmed to enter sleep mode after five minutes in idle mode. Lastly, during sleep mode, BMC 500 may shut off entirely except for operation of a sleep controller 550 described below. Sleep controller 550 may wake up BMC 500 periodically to poll all BMBs 600, run diagnostics, and notify a user or main system controller 110 of any problems.

As shown in FIG. 5, BMC 500 comprises a BMC processor 510, programmable I/O ports 521, a controller area network (CAN) bus transceiver 522, a display interface 523, a current sensor 530, a charger interface 540, sleep controller 550, a data storage 560, and a BMB transceiver 700.

BMC processor 510 may include one or more dedicated processing units, application-specific integrated circuits (ASICs), field-programmable gate arrays (FPGAs), or various other types of processors or processing units. BMC processor 510 may be configured to perform computations or perform tasks based on data received from sensors and other interfaces in communication with different systems, subsystems, and/or modules. For example, BMC processor 510 may be programmed to analyze voltage output from each battery cell 230 over time in order to identify any signs of wear or keep track of a number of charge cycles. BMC processor 510 may also be configured to control the other connected systems and subsystems by transmitting messages via the interfaces. For example, BMC processor 510 may detect that battery cells 230 are unable to output full power (e.g., due to cold weather) and send a message to main control system 110 to limit throttle of a vehicle powered by battery cells 230.

Programmable I/O ports 521 may comprise programmable digital input receivers (not shown) and programmable digital output drivers (not shown). The programmable digital input receivers may be configured to receive information from the other connected systems and subsystems, while the programmable digital output drivers output information to the other connected systems and subsystems regarding various states of BMS 200. For example, one output driver of programmable I/O ports 521 may correspond to the operational status of BMS 200. This output driver may be connected to an LED, so that the LED turn on in green during normal operation, in red when there is a problem, and off when battery management system 200 is off. Other states of BMS 200 that may be output via programmable I/O ports 521 include, but not limited to, charging status of battery cells 230, warning indicator for excessive battery cell temperature, or other measurements or statuses that can be represented by a simple indicator (e.g., LED, gauge, etc.).

CAN bus transceiver 522 may include a plurality of CAN bus transceivers be configured to allow BMS 200 to communicate more robustly with the other systems, subsystems, and/or modules through a CAN bus. The CAN bus may be configured to control communication traffic between different systems based on priority to allow more complex transmission of data as the different systems interoperate. In some embodiments, CAN bus transceiver 522 may include one or more bus channels, each dedicated to different CAN protocols (e.g., CANopen, DeviceNet, EnergyBus, ISO-TP, or other standardized messaging protocols). In further embodiments, CAN bus transceiver 522 may allow BMC 500 to be configured and monitored using a personal computer such as a laptop, PC, or other computing systems.

Display interface 523 is configured to connect to a display device (not shown) for communicating various states of BMS 200. The display device may include, but is not limited to, cathode ray tube (CRT), liquid crystal display (LCD), light-emitting diode (LED), gas plasma, a touch screen, or other image projection devices for displaying information to a user. Additionally or alternatively, the display may include one or more LEDs that turn on or off or change colors to represent different states. Display interface 523 may comprise one or more standardized video interfaces such as VGA, DVI, HDMI, mini-DIN, SCART, HDI-45, DisplayPort, and the like.

Current sensor 530 is connected to one of HV power cables 223 to measure the current output from battery cells 230. Any type of current sensors may be used, including hall effect current sensors, DC current sensors, Rogowski coils, split or solid core sensors, open or closed loop sensors, DC shunts, or any other type of sensor for measuring current. Current sensor 530 may allow an accurate and instantaneous reading of the current output, as an indicator of overall health of battery management system 200. For example, a large current draw may indicate an overload of battery cells 230 to be addressed and prevent damage to connected systems and components. In some embodiments, BMC 500 may use the current sensor in conjunction with different measurements from BMBs 600 to assess the health of individual battery cells 230. For example, a measurement of voltage output can be divided by a measurement of current to obtain battery resistance.

Charger interface 540 is an interface for connecting to an external charger 541. Charger interface 540 and external charger 541 may utilize standardized charger connectors such as Type 1 and Type 2 chargers, CHAdeMO, Combined Charging System (CCS), or other charger connectors known in the art. Charger interface 540 may also accept and automatically switch between AC slow charging and DC fast charging protocols, as known in the art.

Sleep controller 550 is configured to control BMC 500 in sleep mode. Sleep controller 550 may be inactive when BMC 500 is in another operating mode and active when BMC 500 is in sleep mode. During sleep mode, sleep controller 550 may wake up BMC 500 periodically (e.g., every 1 hour) to check on battery cells 230. Sleep controller 550 may put BMC 500 to sleep once the battery cell check is complete, thereby reducing power consumption significantly. In some embodiments, BMC 500 may consume only about 5 mA while sleeping, which allows BMS 200 to conserve energy and extend running time.

BMB transceiver 700 is a dedicated module for communicating with BMBs 600 installed on each battery cell 230. BMB transceiver 700 may be constantly communicating with BMBs 600 or communicating at a predetermined interval under certain operating modes, as described above. Further structural and functional details of BMB transceiver 700 will be described below in more detail.

Data storage 560 may be any type of computer-readable storage medium including volatile or non-volatile memory devices, or a combination thereof. Data storage 560 may further comprise commercially available memory modules and storage devices such as flash memory, SSD, or HDD. Data storage 560 may also be integrated into BMC 500 as part of its circuit board or be modular and replaceable by a user.

Data storage 560 is configured to store information about battery cells 230, which may include the measurements received from BMBs 600 and the information determined by BMC 500 described above. Data storage 560 may be shared by BMC processor 510 and BMB transceiver 700, where BMB transceiver 700 continuously writes the information about battery cells 230 to data storage 560 as received from BMBs 600 and BMC processor 510 asynchronously retrieves the information as needed. Conversely, BMC processor 510 may store messages to BMBs 600 in data storage 560, which may then be retrieved by BMC transceiver 700 and eventually transmitted to BMB 600.

Having BMC processor 510 and BMB transceiver 700 communicate through data storage 560 without any direct connection results in separating BMB communication from the rest of the functions of BMC 500. This allows uninterrupted, real time (or near real time) monitoring of battery cells 230 as BMC processor 510 does not need to devote any processing time to the BMB communication (which may take several seconds, as noted above).

In some embodiments, BMC 500 may also comprise a battery cell heater controller (not shown) and/or a battery cell cooler controller (not shown). Controlling temperature ensures proper operation of battery cells 230, and there are many external and internal factors such as weather and prolonged use that affect temperature. The battery cell heater controller and the battery cell cooler controller may be configured to provide temperature control to battery cells 230, so that battery cells 230 stay within an ideal operating temperature range. Many different heating and cooling modalities (e.g., fan, Peltier, liquid cooling system, resistance wires, thick film heaters, and the like) are available for interfacing with the battery cell heater controller and the battery cell cooler controller and are within the scope of disclosed embodiments.

Figure 6:
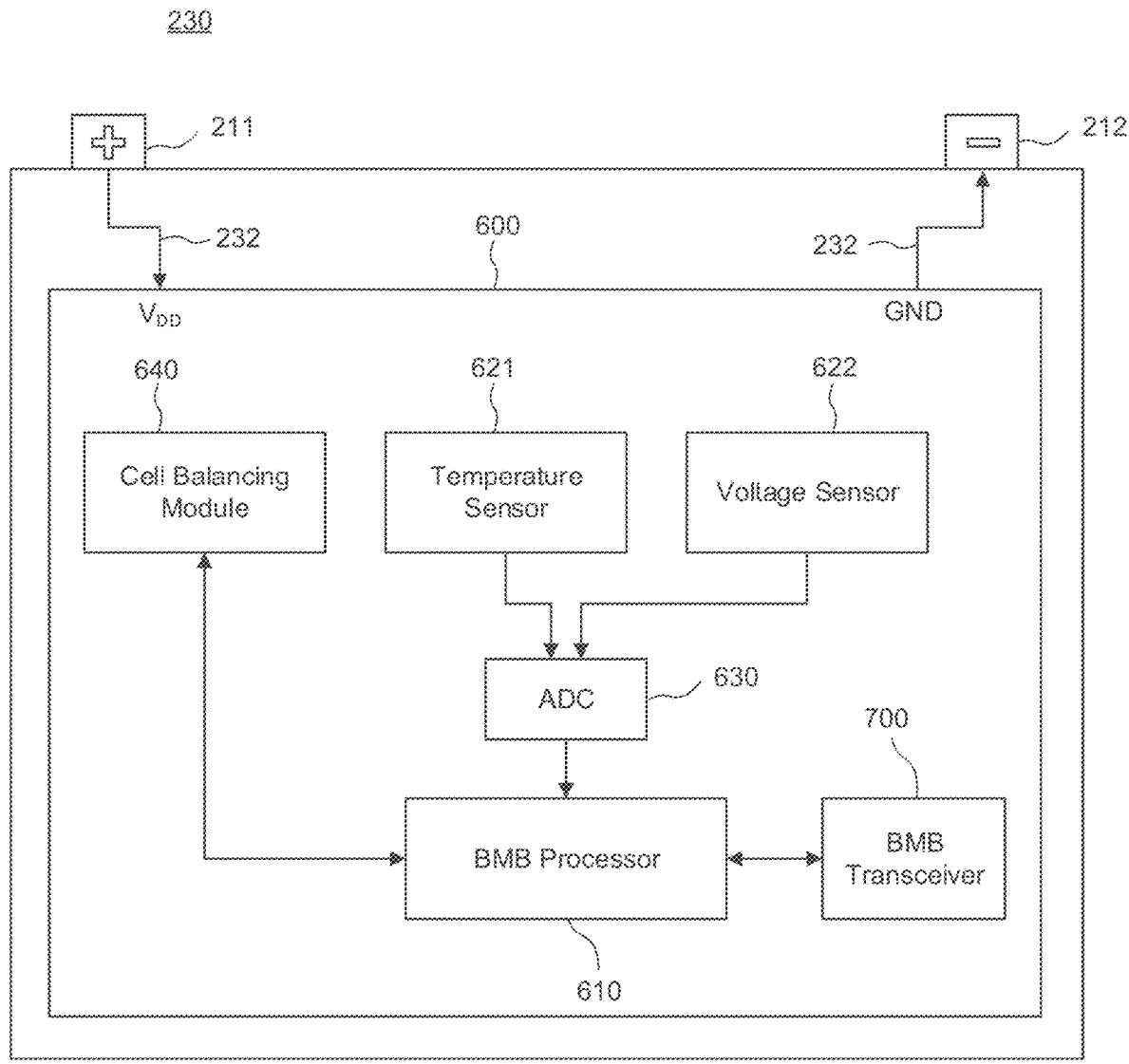
FIG. 6 is a schematic diagram illustrating an exemplary embodiment of a battery management board, consistent with disclosed embodiments.

FIG. 6 is a schematic diagram illustrating an exemplary embodiment of BMB 600, consistent with disclosed embodiments. As described above, BMB 600 is a circuit board coupled to battery cell 230 and configured to manage various aspects of battery cell 230. For example, BMB 600 may be configured to receive messages (e.g., requests for measurements or commands to control charge/discharge) from BMC 500, measure current temperature and voltage of battery cell 230, and adjust operational parameters such as discharge limit or charge limit.

BMB 600 is powered by battery cell 230 by connecting to positive terminal 211 and negative terminal 212 via connections 232 and does not require any external power source. As such, negative terminal 212 of battery cell 230 serves as a virtual ground of BMB 600, and BMB 600 is not connected to a common ground of overall system 100. This allows each BMB 600 to stay independent from the rest of BMS 200, meaning that one BMB 600 need not be configured to communicate with other BMBs or be aware of the other BMBs in BMS 200. Each BMB 600 is also free of any other wire connecting it to another component of BMS 200 or overall system 100.

Consistent with disclosed embodiments, BMB 600 may not be connected to any other BMB 600, BMC 500, or power source (not shown) except for the two connections to positive terminal 211 and negative terminal 212 of battery cell 230. In this way, each BMB 600 is a closed system of its own, which allow it to manage only the particular battery cell 230 it is connected to, keeping its functionalities relatively simple and minimizing power consumption. This also allows BMS 200 to significantly reduce the number of electrical connections needed to build an array of battery cells 230. This, in turn, may allow significant savings in electrical complexity, thereby reducing cost of design, installation, and/or maintenance.

Turning to individual components, BMB 600 comprises a BMB processor 610, a temperature sensor 621, a voltage sensor 622, an analog-to-digital (ADC) converter 630, a cell balancing module 640, and BMB transceiver 700.

BMB processor 610 may include one or more dedicated processing units, application-specific integrated circuits (ASICs), field-programmable gate arrays (FPGAs), or various other types of processors or processing units. BMB processor 610 may be configured to perform computations or perform tasks based on data received from sensors or BMC 500. For example, BMB processor 610 may acquire status information of battery cell 230 from associated sensors (e.g., temperature sensor 621 and/or voltage sensor 622), determine discharge and charge limits, cell balancing, cell health, or any other information useful for assessing the health of battery cell 230, and transmit them to BMC 500 via BMB transceiver 700.

Temperature sensor 621 is configured to measure temperature of the particular battery cell 230 to which BMB 600 is connected. Temperature sensor 621 may be selected from any number of known temperature sensor modules, such as thermocouples, thermistors, integrated circuit (IC) temperature sensors, or the like. Similarly, voltage sensor 622 is configured to measure voltage output of the particular battery cell 230 to which BMB 600 is connected. Voltage sensor 622 may be selected from any number of known voltage sensor modules, such as capacitive type voltage sensors, resistive type voltage sensors, or the like. Other types of sensors for monitoring various aspects of battery cell 230 are also within the scope of the disclosed embodiments. BMB 600 may comprise such sensors in addition to or in place of temperature sensor 621 and voltage sensor 622, of which descriptions will not be provided here for the sake of brevity.

In some embodiments, BMB processor 610 may use measurements from sensors to determine additional information about the status of battery cell 230. For example, the temperature measurement may correspond to how much power battery cell 230 can provide. A correlation curve between temperature and discharge capacity may be unique to the type of battery cell 230 used in BMS 200, but BMB processor 610 may be able to determine discharge capacity given a particular temperature and report it to BMC 500, which may then use it to control other connected systems in the manner described above.

In other embodiments, BMB processor 610 may acquire and provide the temperature and voltage measurements to BMC 500, and BMC processor 510 may be configured to determine the discharge capacity and other derivative parameters based on those measurements. For example, BMC processor 510 may use the voltage measurements from BMB processor 610 and measurements of current from current sensor 530 to determine the resistance of battery cell 230 connected to a particular BMB 600. If the resistance is too high, BMC processor 510 may send a signal to main control system 110 or other subsystems (e.g., subsystems A-C 111-113) to reduce power consumption (e.g., by reducing throttle of a vehicle).

ADC 630 is configured to convert an analog input into a digital output that can be read and understood by processing units such as BMB processor 610. ADC 630 may be a dedicated IC or a functional unit inside either a sensor or BMB processor 610. Here, ADC 630 may receive outputs from temperature sensor 621 and/or voltage sensor 622, convert to a digital value proportional to a reference voltage (e.g., Vdd), and output the result to BMB processor 610.

Capacities of individual battery cells 230 typically vary based on manufacturing variances, aging, impurities, and environmental exposure, which drift even further as battery cells 230 go through multiple charge and discharge cycles. Cell balancing module 640 is configured to compensate for such variation by allowing BMC 500 to charge individual battery cells 230 and/or individual battery cells within each battery cell 230 selectively based on their current capacity.

In some embodiments, BMC 500 uses information gathered from BMBs 600 to track the health of battery cells 230. When BMC 500 detects a particular battery cell deviating from the overall state of battery cells 230, BMC 500 may send a message to BMB 600 to control discharge and charge of battery cell 230 via cell balancing module 640. In response, cell balancing module 640 controls charge shunting for the particular battery cell 230 to which it is connected by selectively connecting a shunt resistor (not shown) to deplete charge from the particular battery cell 230 until the voltage of the particular battery cell 230 matches the voltages of the other battery cells. The shunt resistor is sized to shunt a preset charging current when battery cell 230 is charged to a desired capacity. In some embodiments, the preset charging current may be 200 mA to 750 mA, and cell balancing module 640 may control the charge shunting to maintain voltages of battery cells 230 within a predetermined range of each other (e.g., ±5 mV).

Further, the ability for BMS 200 to interface with multiple battery cells 230 in series or in parallel while retaining control over individual battery cell 230 allows BMS 200 to control charge shunting for high current battery cells (e.g., 400 amp cells). Conventional systems are limited in their abilities to shunt high current battery cells due to the size of the shunt resistors therein and/or their electrical configuration requiring BMC 500 to control shunting for all battery cells 230. In the present embodiment, BMC 500 directs individual BMB 600 to control shunting of the particular battery cell 230 to which it is connected, which distributes the load BMS 200 must bear while shunting the battery cells 230.

Similar to BMB transceiver 700 shown in FIG. 5, BMB transceiver 700 shown in FIG. 6 is dedicated to communicating with the other BMB transceivers 700. The structural and functional characteristics of BMB transceiver 700 will be described below in more detail. In some embodiments, BMB 600 may implement a data storage similar to data storage 560 in FIG. 5, so that data communication and other functions of BMB 600 are performed asynchronously. In other embodiments, BMB processor 510 and BMB transceiver 700 may communicate with each other directly. Keeping BMB transceiver 700 and BMB processor 510 separate as in BMC 500 may be unnecessary, because BMB 600 is only required to communicate with BMC 500 and not with the other BMBs 600. BMC 500, on the other hand, must communicate with all BMBs 600 in BMS 200.

Figure 7:
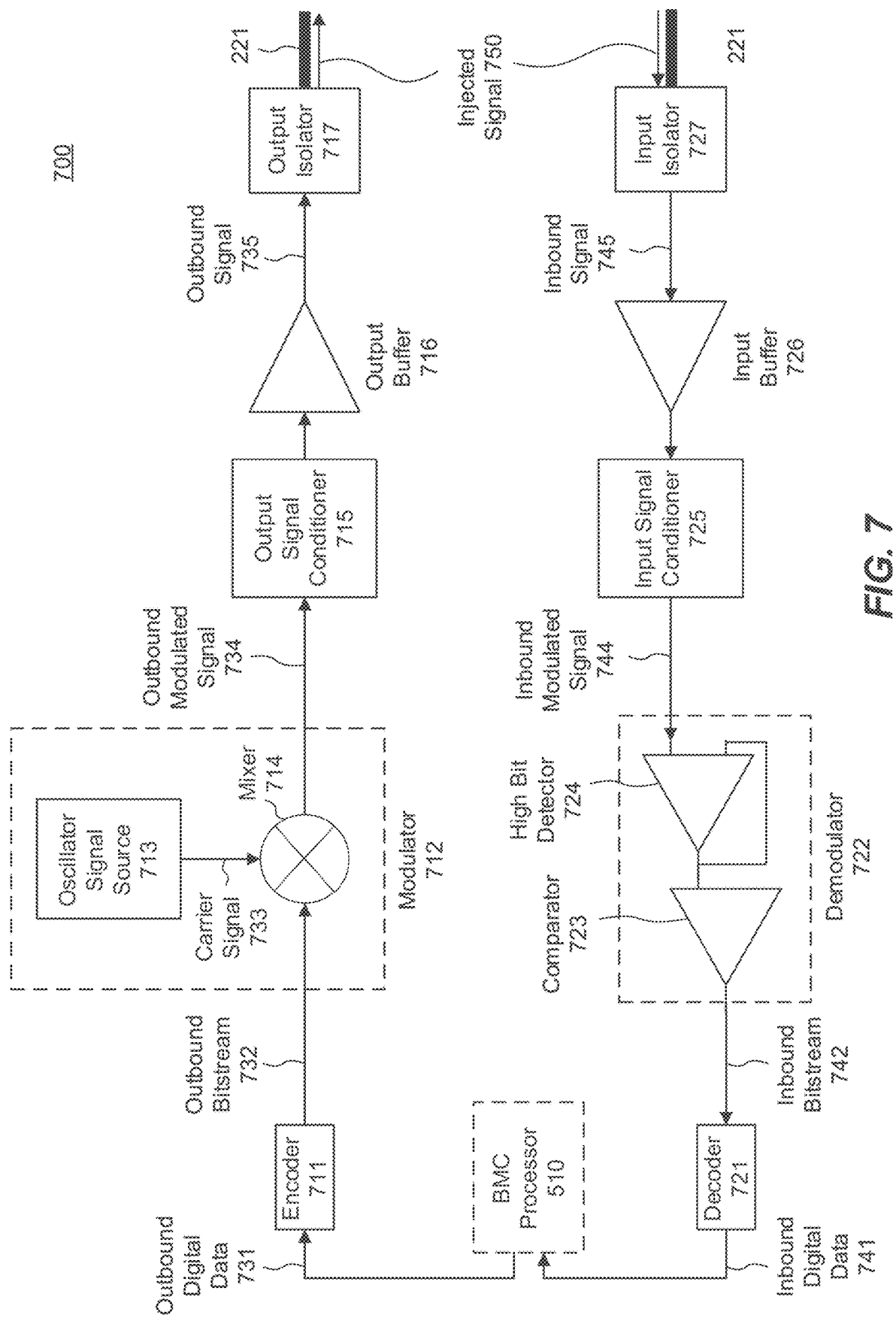
FIG. 7 is a schematic diagram illustrating an exemplary embodiment of a battery management board transceiver, consistent with disclosed embodiments.

FIG. 7 is a schematic diagram illustrating an exemplary embodiment of BMB transceiver 700, consistent with the disclosed embodiments. BMB transceiver 700 of FIG. 7 is described as implemented on BMC 500, but BMB transceiver 700 implemented on BMB 600 may be structured and function substantially similarly except that BMC processor 510 is replaced with BMB processor 610. As noted above, BMB transceiver may be a dedicated module for transmitting and receiving data communication among BMB transceivers 700 located on BMBs 600 and BMC 500. BMB transceiver 700 is also configured to perform signal conditioning, encoding/decoding, and modulation/demodulation of data signals so that they can be transmitted over the HV cables (i.e., HV data cables 221, HV bus bars 222, and HV power cables 223).

As shown in FIG. 7, BMB transceiver 700 comprises an encoder 711 and a decoder 721 pair, a modulator 712 and a demodulator 722 pair, an output signal conditioner 715 and an input signal conditioner 725 pair, an output buffer 716 and an input buffer 726 pair, and an output isolator 717 and an input isolator 727 pair. Further, HV data cables 221 are represented by thick lines as they were in FIG. 1 to indicate that they carry the HV DC voltage, while the other lines connecting components of BMB transceiver 700 are represented by regular thin lines to indicate that they carry low voltage AC/DC signal.

As described above, BMC processor 510 is configured to transmit messages to BMB 600 and receive status information from BMB 600. BMB transceiver comprises of a transmit side circuit (the upper portion of BMB transceiver 700) and a receive side circuit (the lower portion of BMB transceiver 700). The transmit side is configured to receive outbound digital data 731, convert it to an outbound signal 735, and transmit it via HV data cables 221, HV bus bars 222, and HV power cables 223 as an injected signal 750. The receive side is configured to receive injected signal 750 from the cables as an inbound signal 745, convert it to an inbound digital data 741, and output it to BMC processor 510.

For BMB transceiver 700 of BMC 500 as shown in FIG. 5, outbound digital data 731 may be a polling message to all BMBs 600, requesting status information from every battery cell 600, or a command to a particular BMB 600, instructing it to stop charging to balance battery cells 230. Inbound digital data 741 may be the status information received from each BMB 600. For BMB transceiver 700 on BMB 600 as shown in FIG. 6, outbound digital data 731 may be the status information of battery cell 230 to which it is connected. Inbound digital data 741 may be the polling message or the command from BMC 500. Injected signal 750, regardless of whether it originated from BMC 500 or BMB 600, may be a HV DC voltage combined with a low voltage AC voltage representing digital data.

Since all injected signals 750, whether from BMC 500 or any of BMBs 600, share the same wires to reach their intended recipient, BMB transceiver 700 may also be capable of time-division multiplexing (TDM). In other words, injected signals 750 from various sources may be multiplexed over the same wires to minimize overlap. BMB transceiver 700 may implement TDM by utilizing various serial communication protocols natively supported by IC processing units found in BMB transceiver 700.

Alternatively, BMC 500 and BMBs 600 may communicate sequentially, where each transmission of injected signal 750 is triggered by BMC 500. For example, BMC 500 may transmit thae first polling message to BMB 600-1, and BMB 600-1 may transmit a message back to BMC 500 in response. BMC 500 may then transmit a next polling message to BMB 600-2, in response to which BMB 600-2 may transmit a message to BMC 500. This exchange of messages may repeat until BMC 500 cycles through all available BMBs 600. BMC 500 may then cycle through all available BMBs 600 repeatedly until BMC 500 enters sleep mode.

BMB transceiver 700 may also have in place additional safeguards against corrupted or jumbled signals. For example, every injected signal 750 is marked with a start bit and a stop bit that indicate the ends of one unit of communication (e.g., a message from BMC 500 to BMB 600). Decoder 721 may also utilize error checking algorithms known in the art to discard any inbound signal that may have been corrupted. For example, when BMB transceiver 700 on BMC 500 fails to fully decode an incoming signal, BMB transceiver 700 may request a retransmission from the corresponding BMB 600. If the retransmission is unsuccessful three consecutive times, BMC 500 may mark the corresponding BMB 600 as a failure and place BMS 200 in a reduced power mode. BMC 500 may also stop communicating with the failed BMB 600.

In conventional systems, it would not be possible for BMC 500 and BMBs 600 to communicate with each other using injected signal 750 traveling on HV data cables 221, HV bus bars 222, and HV power cables 223. In BMS 200 according to disclosed embodiments, injected signal 750 is only readable by another BMB transceiver 700 (on BMC 500 or BMB 600) using the components described herein with respect to FIG. 7. The other connected systems, subsystems, and devices that use the HV DC voltage as a power source are not affected by, or may even be oblivious to, the modulated signal added onto the HV DC voltage, because the amplitude of the modulated signal is significantly smaller compared to the voltage value of the HV DC voltage (e.g., 3.3V compared to 480V). Only BMC 500 or BMB 600 equipped with BMB transceiver 700 is able to extract the modulated signal from injected signal 750 and decode the information contained therein.

Major components of BMB transceiver 700 that convert outbound digital data 731 to injected signal 750 and back to inbound digital data 741 are described next. The first component is encoder 711, which is configured to package outbound digital data 731 into a data packet according to a predetermined template 900. An exemplary template for such a data packet is further described below with reference to FIG. 9.

Figure 8:
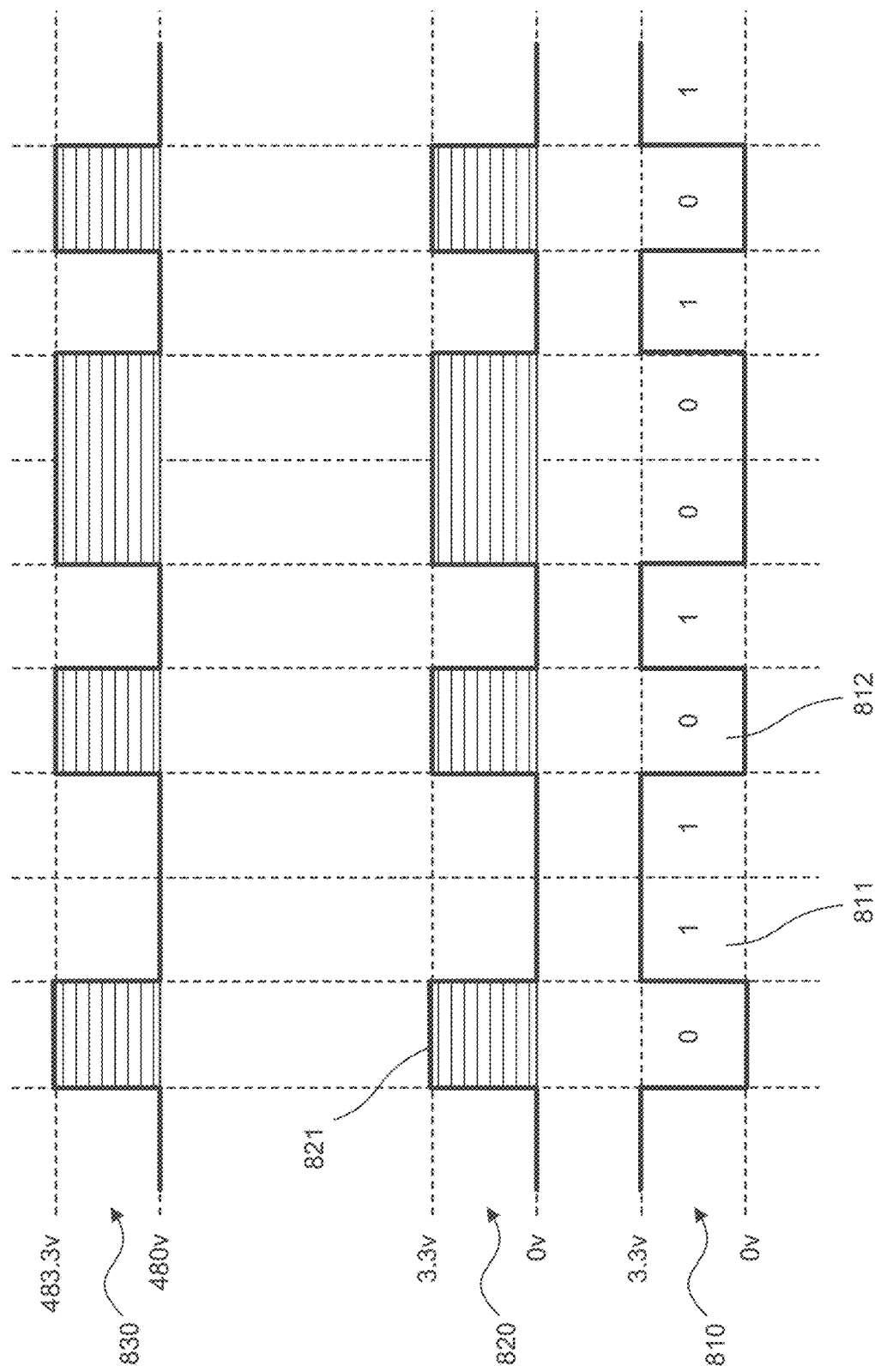
FIG. 8 is a diagram of different exemplary communication signals, consistent with disclosed embodiments.

In some embodiments, encoder 711 may also output the data packet as an outbound bitstream 732—a square wave representing the data packet in a binary sequence of logic 0s and 1s (exemplary signal shown in FIG. 8). The bitstream may have a predetermined amplitude, such as 3.3V, 5V, or the like, and a bit width determined by a predetermined baud rate. For example, the bit width of outbound bitstream 732 encoded at 256,000 bits per second may be 4 microseconds. The baud rate of 256,000 bits per second is only exemplary and other rates may be equally applicable.

Next, modulator 712 is configured to accept outbound bitstream 732 and a carrier signal 733 as inputs and combine them to generate an outbound modulated signal 734. Such modulation is used instead of using the HV DC voltage from battery cells 230 to carry a digital signal. Modulator 712 may implement any signal modulation scheme, such as Amplitude-Shift Keying (ASK), Continuous Phase Modulation (CPM), Frequency-Shift Keying (FSK), Minimum-Shift Keying (MSK), On-Off Keying (OOK), Wavelet Modulation (WDM), or the like. While modulator 712 described herein implements the OOK scheme, other types of modulator 712 implementing other signal modulation schemes are also within the scope of the disclosed embodiments. For example, modulator 712 implementing an FSK scheme may comprise two oscillator signal sources 713 configured to output two signals with distinct frequencies.

In the present embodiment, modulator 712 is configured to implement the OOK scheme and comprises of an oscillator signal source 713 and a mixer 714. Oscillator signal source 713 includes circuits configured to provide a carrier signal 713, such as a numerically controlled oscillator (NCO), a memory storing a plurality of digital oscillator signals, or a voltage-controlled oscillator (VCO). The carrier signal 733 is used as a base signal to be modulated with outbound bitstream 732 into an outbound modulated signal 734, suitable for transmission over HV data cables 221. Carrier signal 733 may be, for example, a sine wave of a fixed amplitude and frequency. Preferably, carrier signal 733 may match the amplitude of outbound bitstream 732 and a frequency higher than the baud rate, which may be, for example, 9 MHz. This frequency of 9 MHz is only exemplary and other frequencies may be equally applicable.

Mixer 714 includes circuits configured to mix outbound bitstream 732 with carrier signal 733, such as a digital multiplier or a complex-valued digital multiplier. Mixer 714 may add, multiply, or perform other manipulation of outbound bitstream 732 and carrier signal 733 as appropriate for the chosen modulation scheme. In the present embodiment, for example, mixer 714 implements the OOK scheme and generates outbound modulated signal 734 by outputting carrier signal 733 during periods corresponding to logic 0 in outbound bitstream 732 and outputting nothing (i.e., 0V) during periods corresponding to logic 1. The resulting output is outbound modulated signal 734 (exemplary signal shown in FIG. 8). While mixer 714 is described here implementing the OOK scheme, other types of mixers are also within the scope of the disclosed embodiments.

Output signal conditioner 715 includes one or more filters and amplifiers with different properties designed to minimize distortion, attenuation, or other degradations of signal from generating outbound modulated signal 734. Any combination of filters and amplifiers may be used as appropriate for the chosen modulation scheme, including, but not limited to, low pass filter, high pass filter, and/or bandpass filter. The end result of output signal conditioner 715 is an outbound signal 735.

Still further, output buffer 716 controls signal flow before outbound signal 735 is finally injected into HV data wire 221 across output isolator 717. Output buffer 716 may be implemented in hardware circuit or in software code. Output buffer 716 may also comprise more than one buffer in series, and output buffer 716 of BMC 500 may be larger than output buffer 716 of BMB 600 in order to account for the larger number of communications that BMC 500 must respond to.

Output isolator 717 is configured to isolate BMB transceiver 700 from the HV DC voltage traveling in HV data cables 221. Output isolator 717 prevents current flow between BMB transceiver 700 and HV data cables 221 and allows only the voltage signal, i.e., outbound signal 735, to pass through. The end result is injected signal 750, which corresponds to outbound signal 735 offset by the HV DC cables (exemplary signal shown in FIG. 8). For example, outbound signal 735 with amplitude of 3.3V combining with the HV DC cables of 480V would yield an AC signal fluctuating between 480V and 483.3V. In some embodiments, output isolator 717 may comprise a galvanic isolator, an opto-isolator, a capacitance isolator, or the like.

Turning to the receive side, BMB transceiver 700 receives injected signal 750 across input isolator 727 to end up with an inbound signal 745. Input isolator 727 may be substantially similar to output isolator 717 except for the direction of signal flow. Specifically, input isolator 727 also shields the HV DC voltage from injected signal 750 and allows only the data signal to enter BMB transceiver 700.

As with output buffer 716, input buffer 726 controls signal flow of inbound signal 745 before the signal is processed through the rest of the receive side. Input buffer 726 may also be implemented in hardware or in software code, and there may be more than one buffer in series. Input buffer 726 of BMC 500 may also be larger than input buffer 726 of BMB 600.

Input signal conditioner 725 includes one or more filters and amplifiers with different properties designed to minimize distortion, attenuation, transient noise, or other degradations of signal introduced while injected signal 750 traveled in HV data cables 221. Any combination of filters and amplifiers may be used as appropriate for the chosen modulation scheme, including, but not limited to, low pass filter, high pass filter, and/or bandpass filter. The end result of input signal conditioner 725 is an inbound modulated signal 744.

In some embodiments, input signal conditioner 725 may also include an automatic gain control circuit (AGC) that dynamically adjusts gain to make the amplitude of resulting inbound modulated signal 744 consistent. A uniform amplitude is desired, because outbound bitstream 732 that corresponds to inbound modulated signal 744 would have been a square wave with a constant amplitude. Other configurations of input signal conditioner 725 are also within the scope of the disclosed embodiments. For example, an input signal conditioner for BMB transceiver 700 implementing the FSK scheme may comprise two sets of filters—one for high frequency and the other for low frequency.

Next, demodulator 722 is provided to remove the modulated portion of inbound modulated signal 744 and extract an inbound bitstream 742. Demodulator 722 operates to reverse the manipulations performed by modulator 712. As such, modulators and demodulators typically work in pairs to convert a bitstream into a modulated signal and vice versa. A demodulator implementing a signal modulation scheme different from that of a corresponding modulator would not be able to demodulate a signal generated by the modulator.

In the present embodiment, demodulator 722 is implemented using the OOK scheme as modulator 712 is. However, BMB transceivers 700 implementing other signal demodulation schemes and corresponding modifications to the version of BMB transceiver 700 described herein are also within the scope of disclosed embodiments.

Here, demodulator 722 comprises a high bit detector 724 and a comparator 723. High bit detector 724 may be configured to output a high voltage when the input signal meets a specific condition. For example, when inbound modulated signal 744 comprises periods of modulated signal and zero voltage as generate by modulator 712, high bit detector 724 may output a high voltage (equal to the amplitude of the high bit) every time it encounters a rising edge or a peak of the modulated signal. The resulting signal output by high bit detector 724 may be a semi-square wave that loosely corresponds to inbound bitstream 742.

Comparator 723 is configured to shape the semi-square wave output from high bit detector 724, so that it is closer to a square wave. Comparator 723 may output a high voltage where the input signal is above a reference voltage and a low voltage where the input signal is below. This output from comparator 723, and thus demodulator 722, is a square wave corresponding to inbound bitstream 742. Thus, the shape of inbound bitstream 742 is substantially identical to that of outbound bitstream 732 used to generate injected signal 750 at the transmit side of another BMB transceiver 700. In some embodiments, inbound bitstream 742 may go through another set of filters and/or amplifiers to remove any distortion or attenuation introduced by demodulator 722 and bring the amplitude to proper logic levels (e.g., Vdd).

Similar to how demodulator 722 demodulates the signal generated by modulator 712, decoder 721 is configured to decode the signal encoded by encoder 711. More specifically, decoder 721 may use predetermined template 900 to identify what each bit in inbound bitstream 742 represents and parse inbound digital data 741 out of inbound bitstream 742.

FIG. 8 is a diagram showing different exemplary communication signals, consistent with disclosed embodiments. An exemplary bitstream 810, an exemplary modulated signal 820, and an exemplary injected signal 830 are shown. While amplitude, bit width, or bit sequence of bitstream 810 are only exemplary, bitstream 810 generally corresponds to a version of outbound bitstream 732 or inbound bitstream 742 consistent with disclosed embodiments. Similarly, modulated signal 820 generally corresponds to versiona of outbound modulated signal 734 or inbound modulated signal 744; and injected signal 830 generally corresponds to a version of injected signal 750, consistent with disclosed embodiments. In this example, bitstream 810 comprises a series of logic 1s 811 and 0s 812. After modulation using the OOK scheme described above, bitstream 810 becomes modulated signal 820. Modulated signal 820 has the same amplitude (i.e., 3.3V) as bitstream 810 but comprises periods of modulated signal 821, where logic 1s 811 are brought to 0V and logic 0s 812 are replaced with an exemplary carrier signal (not shown). Injected signal 830 also has the same amplitude as bitstream 810 and modulated signal 820 but is offset by the HV DC voltage, e.g., 480V, so as to fluctuate between, e.g., 480V and 483.3V. All characteristics of the communication signals shown in FIG. 8, including but not limited to voltage values, labels, waveforms, periods, and frequencies, are only intended to serve as example and are not intended to be limiting in any way.

Figure 9:
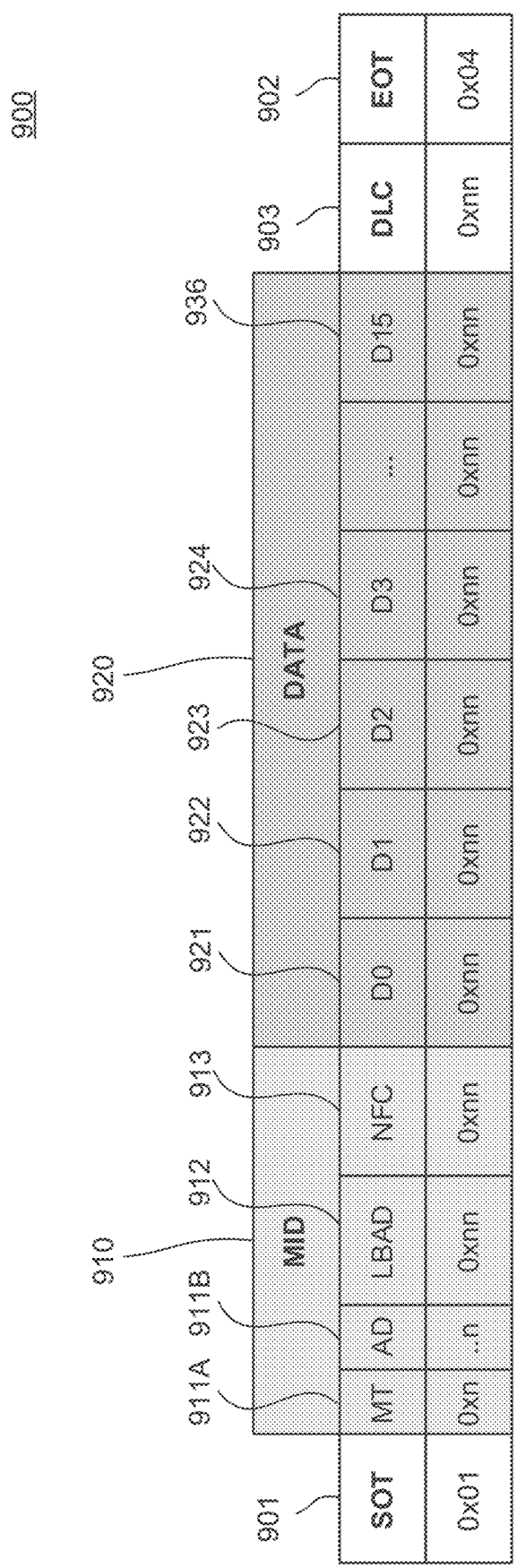
FIG. 9 is an exemplary map of a data packet used for communicating a message, consistent with disclosed embodiments.

FIG. 9 is an exemplary template 900 of a data packet used for communicating a message, consistent with the disclosed embodiments. As used herein, a data packet refers to a unit of communication, in which data (e.g., information, measurement, parameter, message, etc.) is packaged into a single sequence of hexadecimal values. Once a data packet is generated, transmitting the data packet using serial communication involves converting the hexadecimal values into binary values, thereby generating a bitstream referred to in FIG. 7.

Here, template 900 may comprise of up to 16 bytes of data (DATA) 920, accompanied by 1 byte of start of transmission (SOT) code 901, 1 byte of end of transmission (EOT) code 902, 1 byte of data length code (DLC) 903, and 3 bytes of message identification code (MID) 910. In some embodiments, template 900 may be user-configurable and modifiable to comprise more or less information and/or to comprise different sections of different lengths or different values. Each section of template 900 and possible values are described below. The names, values, and structures of different sections described below are only intended to serve as examples.

SOT 901 and EOT 902 are standard, fixed value bytes that represent the start and end of a data packet. Here, they are predetermined to be 0x01 and 0x04, respectively. These values would be 000001 and 000100 in binary.

MID 910 comprises four different subsections: message transmission type (MT) 911A, high nibble address of receiving BMB transceiver 700 (AD) 911B, low byte of the address of the receiving BMB transceiver 700 (LBAD) 912, and node function code (NFC) 913.

MT 911A and AD 911B occupy only one hexadecimal digit, because that is sufficient to account for all possible values. Specifically, MT 911A may take only two values, 0x0 or 0xf, where 0x0 represents a polled message intended for a specific BMB transceiver 700 (e.g., BMC 500 or BMB 600-1), and where 0xf represents a broadcast message intended for all BMBs 600. For example, a polled message may be a request to a specific BMB 600 for status information on the particular battery cell 230 that it is connected to. The receiving BMB 600 may then transmit another polled message to BMC 500 with the status information. On the other hand, a broadcast message may be an instruction to all BMB 600 to enter a particular mode (e.g., sleep mode). The BMBs 600 may perform appropriate actions (e.g., entering sleep mode) in response to such broadcast but while not transmitting any message back to BMC 500.

AD 911B and LBAD 912 combine to form a three hexadecimal digit representing an address. In some embodiments, every BMBs 600 and BMC 500 in BMS 200 may be assigned a number as its address. For example, 0x000 may always be set as BMC 500, and numbers 0x001 to 0x400 may refer to each BMB 600, from BMB 600-1 to BMB 600-1024. Using this convention, up to 0xfff or 4096 distinct addresses are available, which means that BMS 200 can interface with up to 4096 battery cells 230. In some embodiments, BMC 500 may include an auto-mapping feature to map the addresses of all battery cells 230 in BMS 200 during initialization.

NFC 913 may take different values based on whether it is BMC 500 or a BMB 600 that is transmitting a data packet. For example, 0x00 for NFC 913 may represent a command or code to control and monitor a particular BMB.

Considering all subsections of MID 910 together, the value 0x000100 would represent a polled message from BMC 500 to BMB 600-1. The value 0x008000 would represent another polled messaged from BMC 500 to BMB 600-128, as 0x080 is 128 in decimal. The value 0x000000 would represent a polled message from a particular BMB 600 to BMC 500 in response to, e.g., a request from BMC 500 for status information. It is noted that MID 910 may not contain an address of the particular BMB 600 that sent the polled message, because the polled message would be in response to an earlier message from BMC 500 to the particular BMB 600. In other embodiments, template 900 may further comprise an additional section or subsection for encoding the address of a sending BMB 600.

DATA 920 may take any value that represents the digital data intended for transmission (e.g., outbound digital data 721), and DLC 903 may take the value equal to the length of the digital data. DLC 903 serves to provide an indication to decoder 721 that the next two bytes will be EOT 902 and that the previous 0xnn (the value of DLC 903) bytes represent the digital data. In the current example, the digital data can be as large as 16 bytes. However, BMS 200 can be configured to allow even larger data to be transmittable just by increasing the length of DATA 920 in template 900 and noting the length in DLC 903.

Figure 10A:
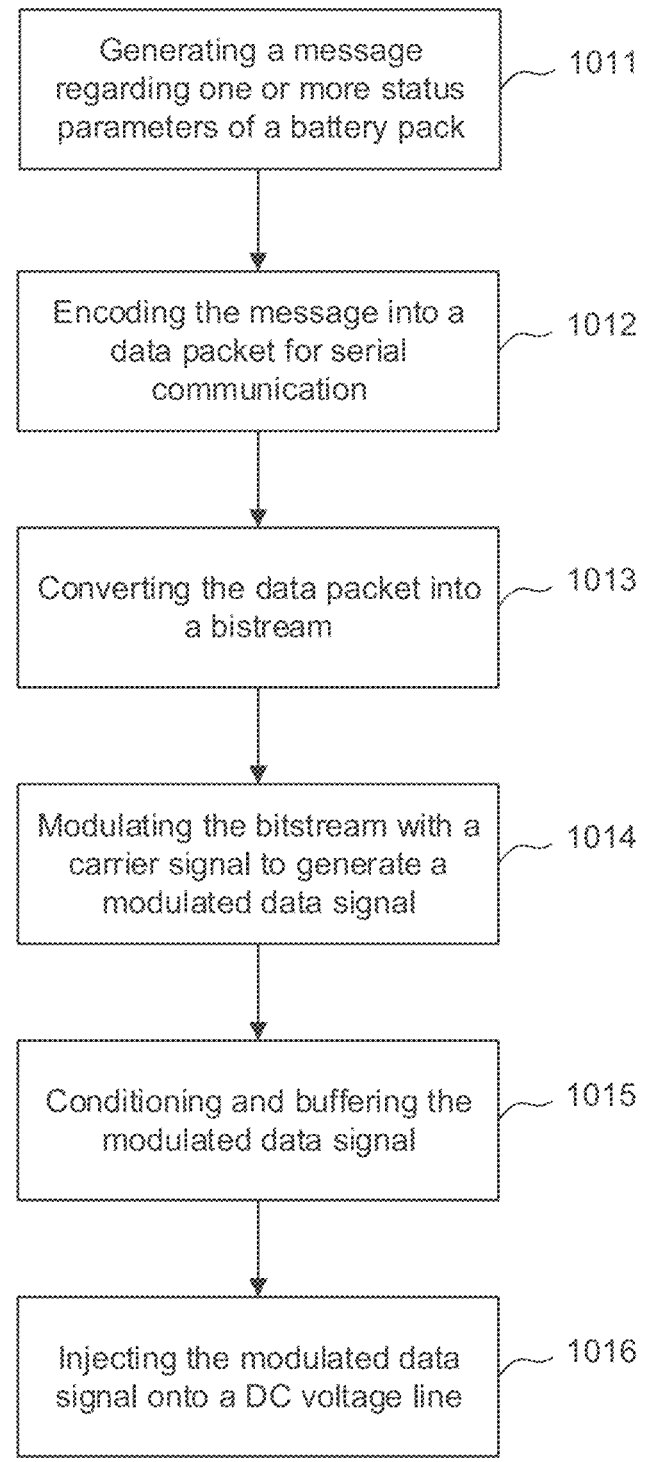
FIG. 10A is a flow chart illustrating an exemplary method for transmitting a signal, consistent with disclosed embodiments.

FIG. 10A is a flow chart illustrating an exemplary method 1010 for transmitting a signal, consistent with disclosed embodiments. Method 1010 may be performed by BMC 500 or BMB 600. In particular, method 1010 may be performed by the transmit side circuit (the upper portion of BMB transceiver 700) as disclosed herein. For example, BMC processor 510 and the circuit components of BMB transceiver 700 (e.g., encoder 711) may perform steps of method 1010. As another example, BMB processor 610 and the circuit components of BMB transceiver 700 may perform steps of method 1010.

Method 1010 includes generating a message regarding one or more status parameters of a battery cell (step 1011); encoding the message into a data packet for serial communication (step 1012); converting the data packet into a bitstream (step 1013); modulating the bitstream with a carrier signal to generate a modulated data signal (step 1014); conditioning and buffering the modulated data signal (step 1015); and injecting the modulated data signal onto a DC voltage line (step 1016).

At step 1011, BMC processor 510 or BMB processor 610 generates a message (i.e., outbound digital data 731) regarding one or more status parameters of battery cell 230. For example, the message may represent status parameters of battery cell 230 such as the current voltage and temperature. In another example, the message may represent a request for the status parameters.

At step 1012, encoder 711 encodes the message into a data packet for serial communication. The data packet may follow predetermined template 900 and contain default values, sections, or subsections as described above. At step 1013, encoder 711 also converts the data packet into outbound bitstream 732 comprised of a string of binary values. At this stage, the message generated at step 1011 is a signal wave, as opposed to digital data stored in memory.

At step 1014, modulator 712 modulates outbound bitstream 732 with carrier signal 733 to generate outbound modulated signal 734. The message generated at step 1011 may now exist as an analog signal wave, suitable for transmission over wires.

At step 1015, output signal conditioner 715 and output buffer 716 conditions and buffers outbound modulated signal 734 to generate outbound signal 735, respectively. The different conditioning circuits and processes may be performed on outbound modulated signal 734, one after another, in parallel, or in any combination thereof. At this stage, the message generated at step 1011 is outbound signal 735, ready to be transmitted to other BMB transceivers 700.

At step 1016, output isolator 717 injects outbound modulated signal 734 onto HV data cables 221 or HV bus bars 222. Such injection effectively loads outbound modulated signal 734 onto the HV DC voltage, shifting the entire signal up by the amount of voltage carried by the HV DC voltage. Injected signal 750 may then travel to the other BMB transceivers 700 instantaneously, where it is received by the intended recipient and processed through the method of FIG. 10B.

Figure 10B:
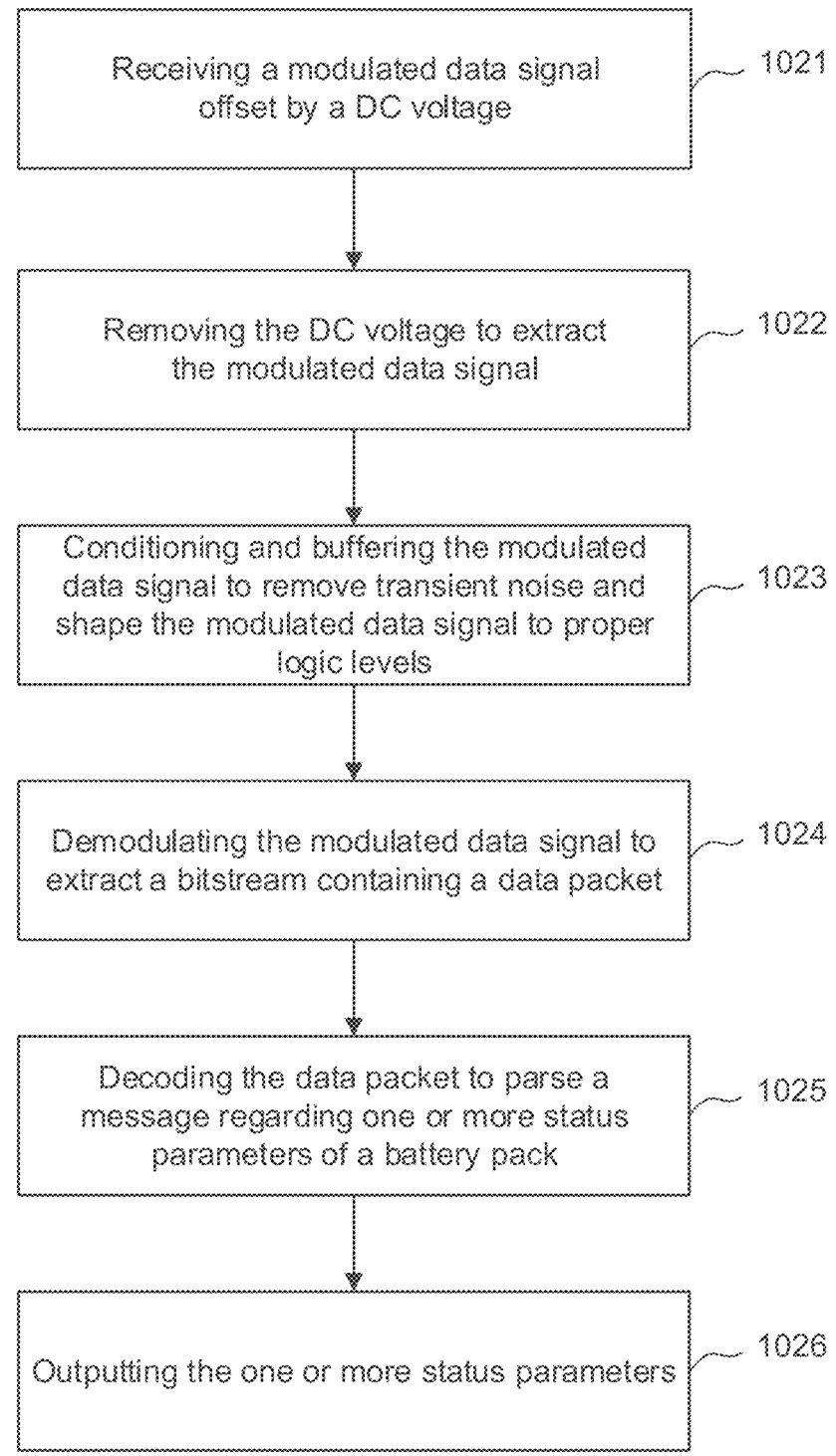
FIG. 10B is a flow chart illustrating another exemplary method for receiving a signal, consistent with disclosed embodiments.

FIG. 10B is a flow chart illustrating another exemplary method 1020 for receiving a signal, consistent with the disclosed embodiments. Method 1020 may be performed by BMC 500 or BMB 600. In particular, method 1020 may be performed by the receive side circuit (the lower portion of BMB transceiver 700) as disclosed herein. For example, BMC processor 510 and the circuit components of BMB transceiver 700 (e.g., decoder 721) may perform steps of method 1020. As another example, BMB processor 610 and the circuit components of BMB transceiver 700 may perform steps of method 1020.

Method 1020 includes receiving a modulated data signal offset by a DC voltage (step 1021); removing the DC voltage to extract the modulated data signal (step 1022); conditioning and buffering the modulated data signal to remove transient noise and shape the modulated data signal to proper logic levels (step 1023); demodulating the modulated data signal to extract a bitstream containing a data packet (step 1024); decoding the data packet to parse a message regarding one or more status parameters of a battery cell 230 (step 1025); and outputting the one or more status parameters (step 1026).

At step 1021, BMB transceiver 700 receives injected signal 750 offset by the HV DC voltage. At this point, it is unknown what data injected signal 750 contains. At step 1022, input isolator 727 removes the HV DC voltage from injected signal 750 to extract inbound signal 745 by receiving it over input isolator 727, which blocks the HV DC voltage.

At step 1023, input signal conditioner 725 and input buffer 726, respectively, conditions and buffers inbound signal 745 to remove transient noise and shape inbound signal 745 to proper logic levels. For example, passing inbound signal 745 through a low pass filter removes transient noise not blocked by input isolator 727 and passing the signal through a high pass filter removes high frequency noise that may have been caused by interference. At this stage, injected signal 750 received at step 1021 is cleaned to be inbound modulated signal 744, but the signals may still be in more or less the same shape, which cannot as yet be read by a processor.

At step 1024, demodulator 722 demodulates inbound modulated signal 744 to extract inbound bitstream 742 containing a data packet. The process for demodulating may depend substantially on how inbound modulated signal 744 was initially modulated, and one exemplary demodulator for demodulating a OOK modulated signal is provided above with respect to FIG. 7. At this stage, injected signal 750 received at step 1021 has been converted into inbound bitstream 742, which may loosely follow the shape of a digital signal.

At step 1025, decoder 721 reads inbound bitstream 742 to obtain the data packet and decodes the data packet to parse a message regarding one or more status parameters of battery cell 230. Similar to how demodulation was dependent on how the signal was modulated, decoding the data packet is also dependent on how the signal was encoded. One exemplary process of decoding a data packet generated based on template 900 is provided above with respect to FIGS. 7 and 9. At this stage, injected signal 750 received at step 1021 is fully converted into a computer-readable message, which is output to either BMC processor 510 or BMB processor 610 at step 1026.

BMS 200 addresses various shortcomings of conventional battery management systems. BMS 200 is generally applicable to power a system that requires significant electrical power. The advantages of BMS 200 and other techniques provide for a new vehicle power system for motive power to a vehicle having batteries in a safe, convenient, and economical manner.

In conventional vehicles powered by batteries, different components necessary for providing the motive power are scattered throughout the vehicle. This makes installation, maintenance, and repair of the power system difficult and costly. In this respect, the vehicle power system according to the present disclosure substantially departs the conventional concepts and designs of the prior art, and in doing so provides an apparatus for providing motive power to a vehicle having batteries in a safe, convenient, and economical manner.

Figure 11A:
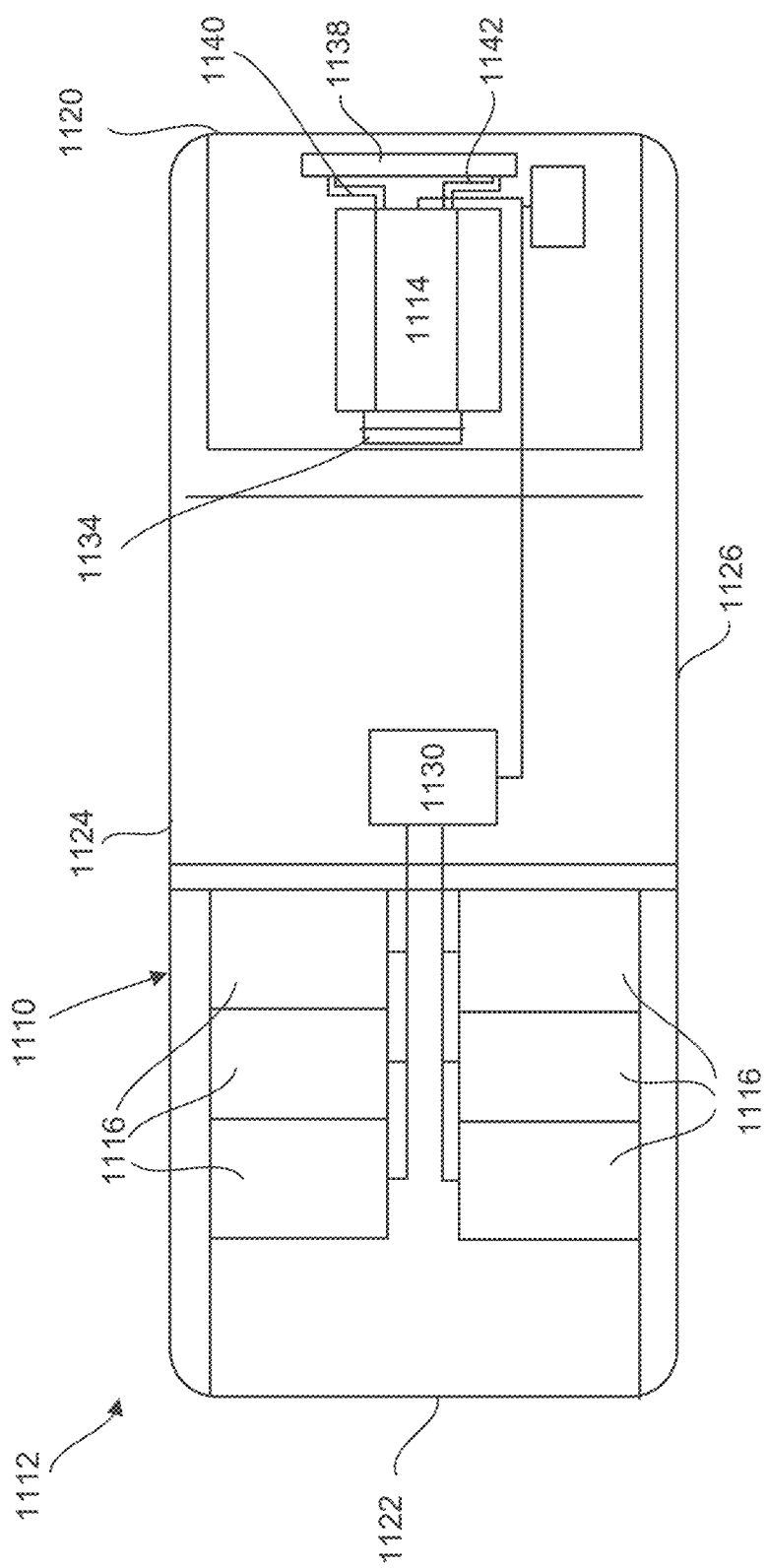
FIG. 11A is a top-down view of an exemplary vehicle power system, consistent with disclosed embodiments.

Referring to FIG. 11A, a vehicle power system 1110 of present disclosure provides motive power to a vehicle 1112. Vehicle 1112 has a forward end 1120, a rearward end 1122, a left side 1124, and a right side 1126. Vehicle power system 1110 has an engine 1114 for providing motive power to vehicle 1112 and batteries 1116 for providing electrical power to engine 1114. In some embodiments, engine 1114 may comprise a combustion engine, an electrical motor, or a combination of the two. The motive power and electrical power are provided in a safe, convenient, and economical manner. Furthermore, vehicle power system 1110 may be solid-state, where it is solely comprised of non-moving components. In other embodiments, vehicle power system 1110 may not comprise of any component with a belt or pulley system. For example, an alternator that may be found with a conventional internal combustion engine (ICE) (not shown) may be replaced with a DC-to-DC converter, and other conventional components of ICE, such as a water pump, a vacuum pump, or an air conditioner compressor, are replaced with electronic parts.

Engine 1114 is positioned in a forward region of vehicle 1112 (e.g., in an engine bay). Batteries 1116 are positioned in a rearward region of vehicle 1112. Batteries 1116 and engine 1114 are operatively coupled. The positions of these components relative to each other and to vehicle 1112 is exemplary and can be altered without departing from the scope of the present disclosure. For example, engine 1114 may be positioned in the rearward region of vehicle 1112 and used in a pusher configuration as in a Type D school bus or other vehicles having a propulsion system in the rearward region. In some embodiments, batteries 1116 may be positioned in the intermediate region of vehicle 1112 or spread throughout the floor of vehicle 1112. This may allow vehicle 1112 to minimize or eliminate the need for driveshaft obstructions. Further, having engine 1114 in the rearward region or batteries 1116 in the intermediate region may allow the floor of vehicle 1112 to be lowered, thus making the vehicle more accessible for occupants.

A power distributor unit 1130 is positioned in an intermediate region of vehicle 1112. In some embodiments, power distributor unit 1130 may be positioned else where in vehicle 1112, such as on the side of engine 1114 where a valve cover may be found in conventional vehicles.

An adaptor plate 1134 on a rearward end of engine 1114 couples engine 1114 to a transmission of the vehicle forwardly of power distributor unit 1130. Adaptor plate 1134 may comprise one or more sensors that determine a location of a motor shaft using one or more encoders. The encoder(s) may comprise a rotary encoder with a toothed plate, where each tooth represents an angular location of the rotation of the motor shaft coupled to, e.g., a gearbox or a transmission. In some embodiments, other systems or subsystems of vehicle 1112 (e.g., main control system 110 or subsystems A-C 111-112) may use outputs of the one or more sensors to control functionalities of vehicle 1112 such as indicators and/or warning lights on a dashboard of vehicle 1112 and power steering systems.

A radiator 1138 is coupled to vehicle 1112 forwardly of engine 1114. A coolant input line 1140 and a coolant output line 1142 operatively couple radiator 1138 and engine 1114.

Figure 11B:
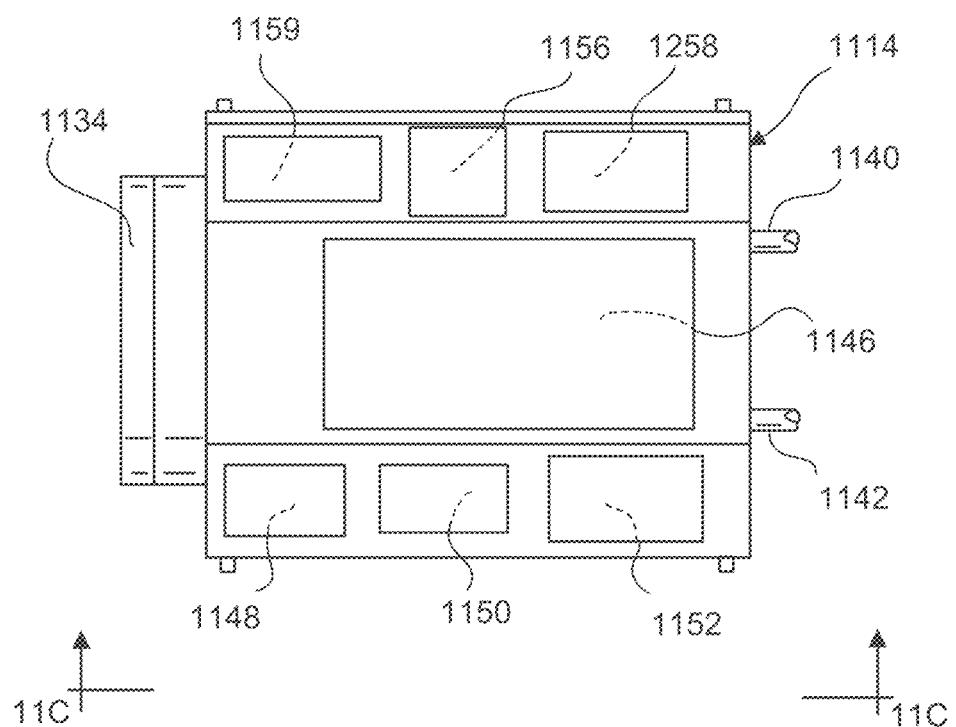
FIG. 11B is a top-down view of an exemplary vehicle engine, consistent with disclosed embodiments.

Referring to FIG. 11B, an inverter board 1146 is located above engine 1114. A plurality of electrical components are provided and located above engine 1114 beneath inverter board 1146. The plurality of electrical components include an air pump 1148, an in-line heater pump 1150, and a coolant pump 1152 adjacent to left side 1124 of vehicle 1112. The plurality of electrical components also include an air conditioner compressor 1154, an AC-to-DC power converter 1156, and a cooling block pump 1158 adjacent to right side 1126 of vehicle 1112. While not shown in FIG. 11B, power distributor unit 1130 may also be placed on engine 1114 without departing from the scope of present disclosure.

Figure 11C:
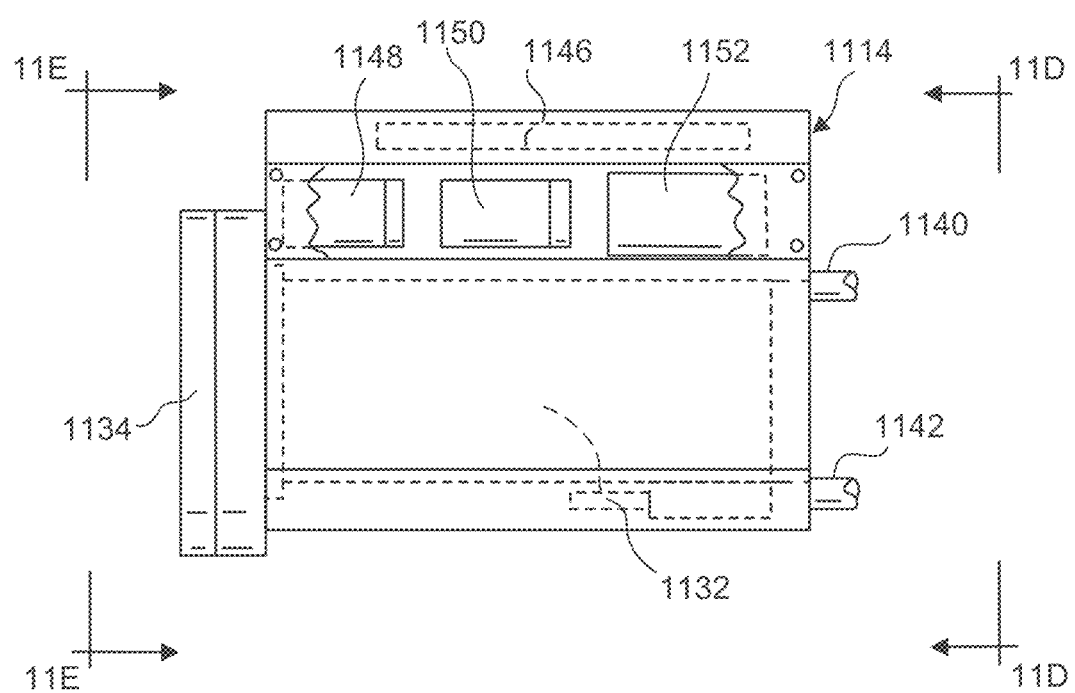
FIG. 11C is a left side view of the exemplary vehicle engine, consistent with disclosed embodiments.
Figure 11D:
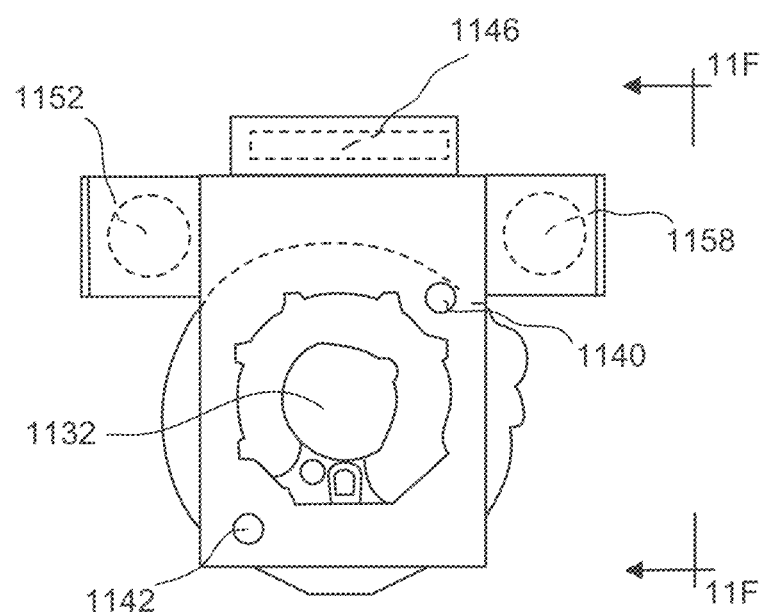
FIG. 11D is a front side view of the exemplary vehicle engine, consistent with disclosed embodiments.
Figure 11E:
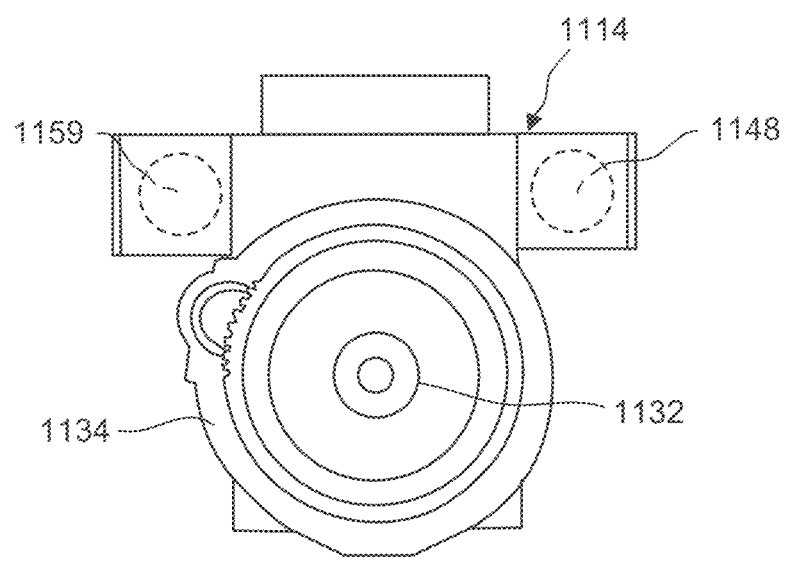
FIG. 11E is a rear side view of the exemplary vehicle engine, consistent with disclosed embodiments.
Figure 11F:
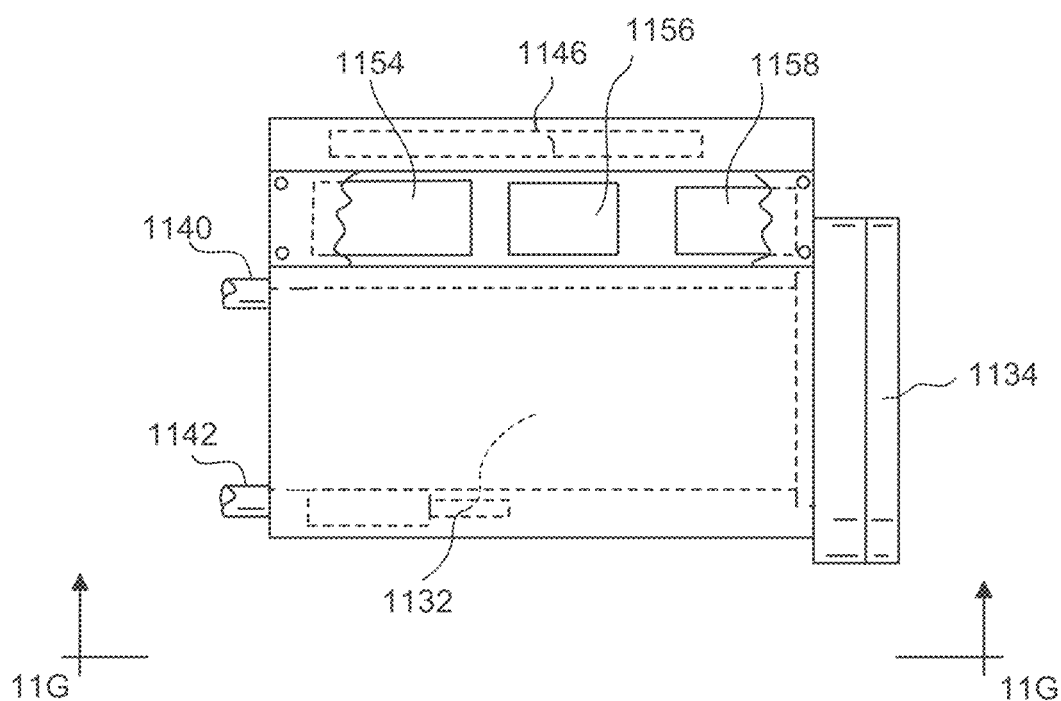
FIG. 11F is a right side view of the exemplary vehicle engine, consistent with disclosed embodiments.
Figure 11G:
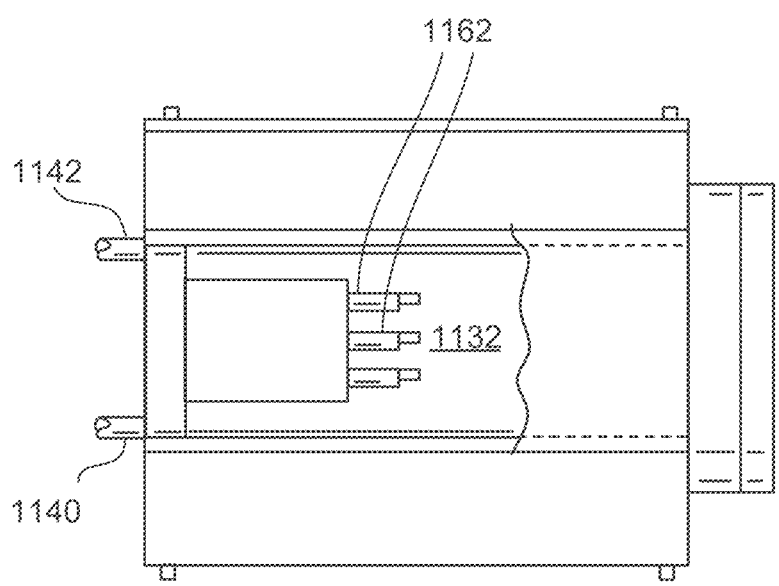
FIG. 11G is a bottom-up view of an exemplary vehicle engine, consistent with disclosed embodiments.

FIGS. 11C-11F are different views of engine 1114 that illustrate relative positions of the components described above. Specifically, FIG. 11C is a left side view of engine 1114, taken along a section line 11C-11C in FIG. 11B. FIG. 11D is a front side view of engine 1114, taken along a section line 11D-11D in FIG. 11C. FIG. 11E is a rear side view of engine 1114, taken along a section line 11E-11E in FIG. 11C. Lastly, FIG. 11F is a right side view of engine 1114, taken along a section line 11F-11F in FIG. 11D. Referring to FIG. 11G, electrical connectors 1162 are provided beneath engine 1114 to removably couple power distributor 1130 to the engine.

In some embodiments, a DC-to-DC converter (not shown) may be provided to replace or supplement an alternator system such as found in conventional vehicles. The DC-to-DC converter may be positioned beneath engine 1114, such as where an oil pan may be found in conventional vehicles, in a charger unit (not shown) coupled to batteries 1116. The charger unit may comprise various electronic components for interfacing with an external charging port. In some embodiments, the charger unit may comprise a charger, the DC-to-DC converter, and/or AC-to-DC power converter 1156.

Engine 1114 and the other components described above form an integrated assembly of parts that provide motive power to vehicle 1112. Compared to conventional systems that comprise discrete, unassembled parts that must be installed in a vehicle one by one, the integrated assembly according to disclosed embodiments simplifies manufacturing assembly lines by offering a single package that can be installed at together one time. Similarly, replacing the integrated assembly may also be simplified, where the integrated assembly can be removed and reinstalled together at one time.

The computer-readable storage medium of the present disclosure may be a tangible device that can store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The computer-readable program instructions of the present disclosure may be assembler instructions, instruction-set-architecture (ISA) instructions, machine instructions, machine-dependent instructions, microcode, firmware instructions, state-setting data, or source code or object code written in any combination of one or more programming languages, including an object-oriented programming language, and conventional procedural programming languages. The computer-readable program instructions may execute entirely on a computing device as a stand-alone software package, or partly on a first computing device and partly on a second computing device remote from the first computing device. In the latter scenario, the second, remote computing device may be connected to the first computing device through any type of network, including a local area network (LAN) or a wide area network (WAN).

The flowcharts and block diagrams in the figures illustrate examples of the architecture, functionality, and operation of possible implementations of systems, methods, and devices according to various embodiments. It should be noted that, in some alternative implementations, the functions noted in blocks may occur out of the order noted in the figures. For example, two blocks shown in succession may, in fact, be executed substantially concurrently, or the blocks may sometimes be executed in the reverse order, depending upon the functionality involved.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" means that a particular feature, structure, or characteristic described in connection with the embodiment can be included in at least one embodiment. The appearance of the phrases "one embodiment" "some embodiments" or "another embodiment" in various places in the present disclosure do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. For example, two blocks shown in succession may, in fact, be executed substantially concurrently, or the blocks may sometimes be executed in the reverse order, depending upon the functionality involved. Likewise, additional steps may be included in such methods, and certain steps may be omitted or combined, in methods consistent with various embodiments.

As used in the present disclosure, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

As used in the present disclosure, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Additionally, the articles "a" and "an" as used in the present disclosure and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

Although the elements in the following method claims, if any, are recited in a particular sequence, unless the claim recitations otherwise imply a particular sequence for implementing some or all of those elements, those elements are not necessarily intended to be limited to being implemented in that particular sequence.

It is appreciated that certain features of the present disclosure, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the specification. Certain features described in the context of various embodiments are not essential features of those embodiments, unless noted as such.

It will be further understood that various modifications, alternatives and variations in the details, materials, and arrangements of the parts which have been described and illustrated in order to explain the nature of described embodiments may be made by those skilled in the art without departing from the scope. Accordingly, the following claims embrace all such alternatives, modifications and variations that fall within the terms of the claims.

I claim:

1. A battery management system comprising:
   a plurality of batteries connected together to form a battery group, the battery group having first and second terminals;
   a plurality of monitoring boards, each of the plurality of monitoring boards being associated with a subgroup of the plurality of batteries, wherein the subgroup corresponds to less than all of the plurality of batteries; and
   a controller connected to the first and second terminals of the battery group;
   wherein:
   each of the monitoring boards is configured to:
      receive and monitor a battery parameter associated with the subgroup of batteries corresponding to the respective monitoring board, and
      transmit the battery parameter to the controller through at least one of the first or second terminals; and
   the controller is configured to:
      receive the battery parameter from each of the monitoring boards through at least one of the first or second terminals, and
      adjust performance of the plurality of batteries based on the received battery parameter.

2. The battery management system of claim 1, wherein the plurality of batteries within the battery group are connected in series.

3. The battery management system of claim 1, wherein the controller is configured to communicate with the plurality of monitoring boards through at least one of the first or second terminals of the battery group.

4. The battery management system of claim 1, wherein each of the plurality of monitoring boards is individually addressable by the controller.

5. The battery management system of claim 1, wherein the plurality of batteries are connected in parallel and in series.

6. The battery management system of claim 1, wherein the monitoring boards comprise an isolator circuit configured to block a direct current voltage.

7. The battery management system of claim 1, wherein the monitoring boards are configured to measure at least one of voltage, resistance, temperature, discharge and charge limits, or health of the plurality of batteries.

8. The battery management system of claim 1, wherein the monitoring boards are configured to transmit data regarding the battery parameter associated with corresponding subgroups of batteries through digitally modulated signals to the controller, the digitally modulated signals being combined with a direct current voltage.

9. The battery management system of claim 1, wherein the subgroup is a single battery.

10. The battery management system of claim 1, wherein the subgroup corresponds to multiple batteries.

11. The battery management system of claim 1, wherein each of the monitoring boards is configured to control a voltage provided by the respective subgroup of batteries.

12. The battery management system of claim 11, wherein the monitoring boards are configured to measure voltages and temperatures of corresponding subgroups of batteries.

13. The battery management system of claim 1, wherein the monitoring boards are configured to transmit the battery parameter to the controller through a same one of the first or second terminals of the battery group.

14. The battery management system of claim 13, wherein the first terminal is a most positive terminal of the battery group, and the second terminal is a most negative terminal of the battery group.

15. The battery management system of claim 1, wherein the monitoring boards are configured to receive, from the controller, commands to control a battery discharge and adjust discharge limits of subgroups of batteries.

16. The battery management system of claim 1, wherein the monitoring boards are configured to receive, from the controller, commands to control a battery charge and adjust charge limits of subgroups of batteries.

17. The battery management system of claim 1, wherein the monitoring boards comprise a processor, a transceiver, an analog-to-digital converter (ADC), a temperature sensor, and a voltage sensor, wherein:
   the temperature sensor is configured to measure a temperature of a corresponding subgroup of batteries and provide the temperature to the ADC;
   the voltage sensor is configured to measure a voltage of the corresponding subgroup of batteries and provide the voltage to the ADC; and
   the processor is configured to receive a temperature value and a voltage value from the ADC and transmit the temperature value and voltage value as battery parameters to the controller through the transceiver.

18. The battery management system of claim 17, wherein the transceiver is configured to transmit the battery parameters using a modulation signal to the controller.

19. The battery management system of claim 18, wherein the controller is configured to demodulate the modulation signal to obtain the battery parameters of the corresponding subgroup of batteries.

20. A vehicle power system for providing motive power to a vehicle, the vehicle power system comprising:

a motor for providing motive power; and
a battery management system, comprising:
- a plurality of batteries connected together to form a battery group, the battery group having first and second terminals;
- a plurality of monitoring boards, each of the plurality of monitoring boards being associated with a subgroup of the plurality of batteries, wherein the subgroup corresponds to less than all of the plurality of batteries; and
- a controller connected to the first and second terminals of the battery group;

wherein:
- each of the monitoring boards is configured to:
  - receive and monitor a battery parameter associated with the subgroup of batteries corresponding to the respective monitoring board, and
  - transmit the battery parameter to the controller through at least one of the first or second terminals; and
- the controller is configured to:
  - receive the battery parameter from each of the monitoring boards through at least one of the first or second terminals, and
  - adjust performance of the plurality of batteries based on the received battery parameter;

wherein:
- the plurality of batteries are configured to provide power to the motor; and
- the battery management system is configured to monitor the plurality of batteries.

\* \* \* \* \*